United States Patent
Pang et al.

(10) Patent No.: US 9,715,937 B1
(45) Date of Patent: Jul. 25, 2017

(54) DYNAMIC TUNING OF FIRST READ COUNTERMEASURES

(71) Applicant: SanDisk Technologies LLC, Plano, TX (US)

(72) Inventors: Liang Pang, Fremont, CA (US); Yingda Dong, San Jose, CA (US); Jiahui Yuan, Fremont, CA (US); Charles Kwong, Redwood City, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/182,853

(22) Filed: Jun. 15, 2016

(51) Int. Cl.
*G11C 16/26* (2006.01)
*G11C 16/04* (2006.01)
*G11C 16/34* (2006.01)
*G11C 16/30* (2006.01)
*G11C 16/24* (2006.01)
*G11C 16/10* (2006.01)

(52) U.S. Cl.
CPC .......... *G11C 16/26* (2013.01); *G11C 16/0483* (2013.01); *G11C 16/10* (2013.01); *G11C 16/24* (2013.01); *G11C 16/30* (2013.01); *G11C 16/3459* (2013.01)

(58) Field of Classification Search
CPC ..... G11C 16/0483; G11C 16/10; G11C 16/24; G11C 16/26; G11C 16/30; G11C 16/3459
See application file for complete search history.

(56) References Cited

U.S. PATENT DOCUMENTS

| | | | |
|---|---|---|---|
| 7,460,407 B2 | 12/2008 | Mokhlesi et al. | |
| 7,542,344 B2 * | 6/2009 | Kim | G11C 11/5628 365/185.03 |
| 7,613,045 B2 | 11/2009 | Murin et al. | |
| 8,116,160 B2 * | 2/2012 | Hwang | G06F 11/1068 365/185.22 |
| 8,238,185 B2 * | 8/2012 | Lee | G11C 5/143 365/189.09 |
| 8,547,746 B2 * | 10/2013 | Tanzawa | G11C 5/14 365/185.18 |

(Continued)

OTHER PUBLICATIONS

International Search Report & The Written Opinion of the International Searching Authority dated Apr. 24, 2017, International Application No. PCT/US2017/018637 filed Feb. 21, 2017.

*Primary Examiner* — Vanthu Nguyen
(74) *Attorney, Agent, or Firm* — Vierra Magen Marcus LLP

(57) ABSTRACT

Techniques are provided for improving the accuracy of read operations of memory cells, where the threshold voltage (Vth) of a memory cell can shift depending on when the read operation occurs. Countermeasures are provided for a first read situation in which a memory is read after a power on event or after a long delay since a last read. Read voltages of lower or higher programmed data states are set according to a positive or negative temperature coefficient (Tco), respectively. Read voltages for error recovery can be set similarly. In another aspect, a wait period between a dummy voltage and a read voltage is a function of temperature. In another aspect, word line voltages of unselected blocks are set according to a negative Tco. In another aspect, pass voltages are set based on a Tco for each programmed data state.

18 Claims, 26 Drawing Sheets

(56) References Cited

U.S. PATENT DOCUMENTS

| | | |
|---|---|---|
| 8,687,421 B2 | 4/2014 | Avila et al. |
| 9,001,579 B2 | 4/2015 | Song et al. |
| 9,053,765 B2 | 6/2015 | Fukano |
| 9,535,620 B2 * | 1/2017 | Kim ..................... G06F 3/0619 |
| 2007/0019474 A1 | 1/2007 | Kim et al. |
| 2008/0031066 A1 | 2/2008 | Nandi |
| 2009/0129154 A1 | 5/2009 | Itoh |
| 2014/0140130 A1 | 5/2014 | Song et al. |
| 2016/0118129 A1 | 4/2016 | Muchherla et al. |

* cited by examiner

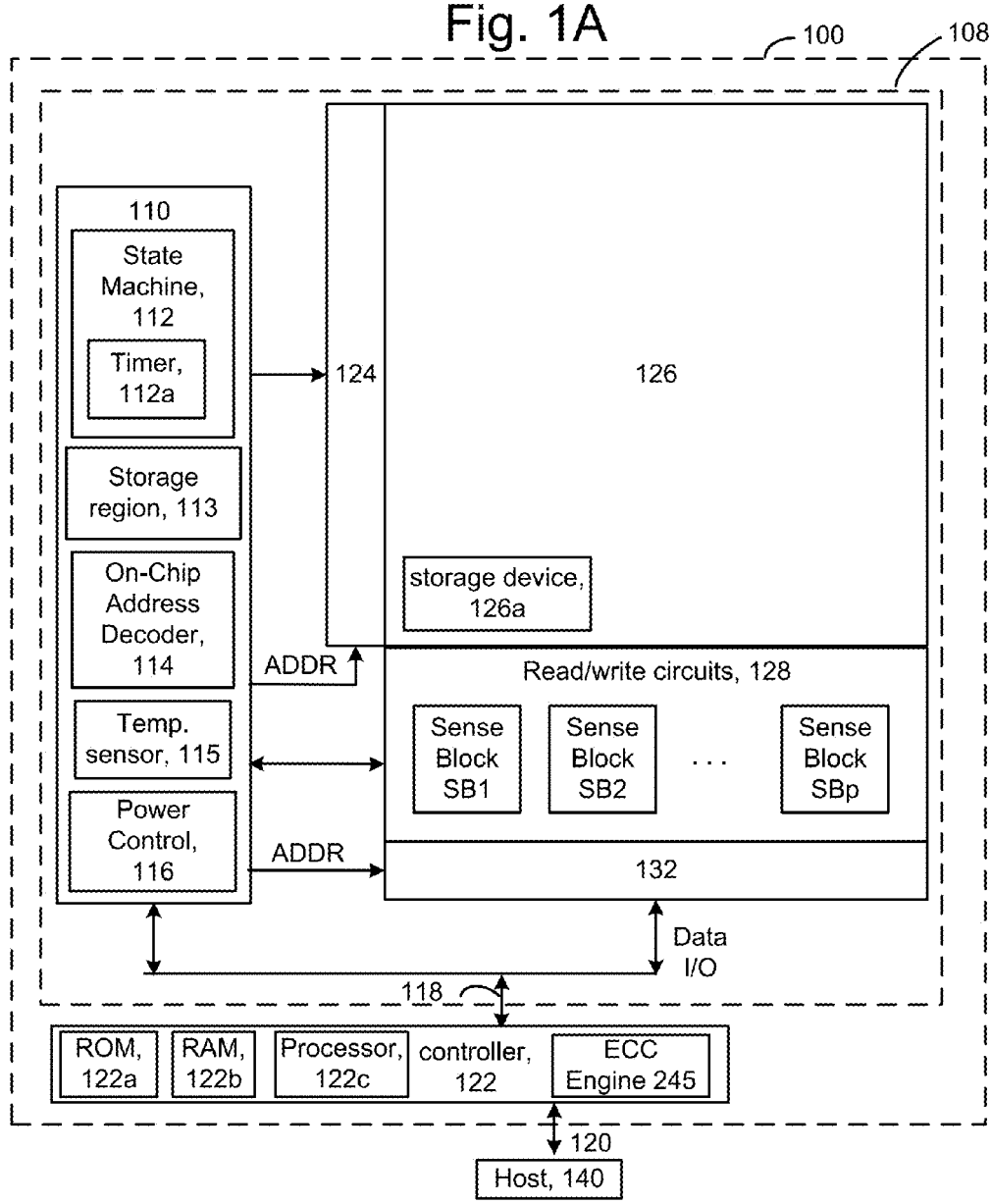

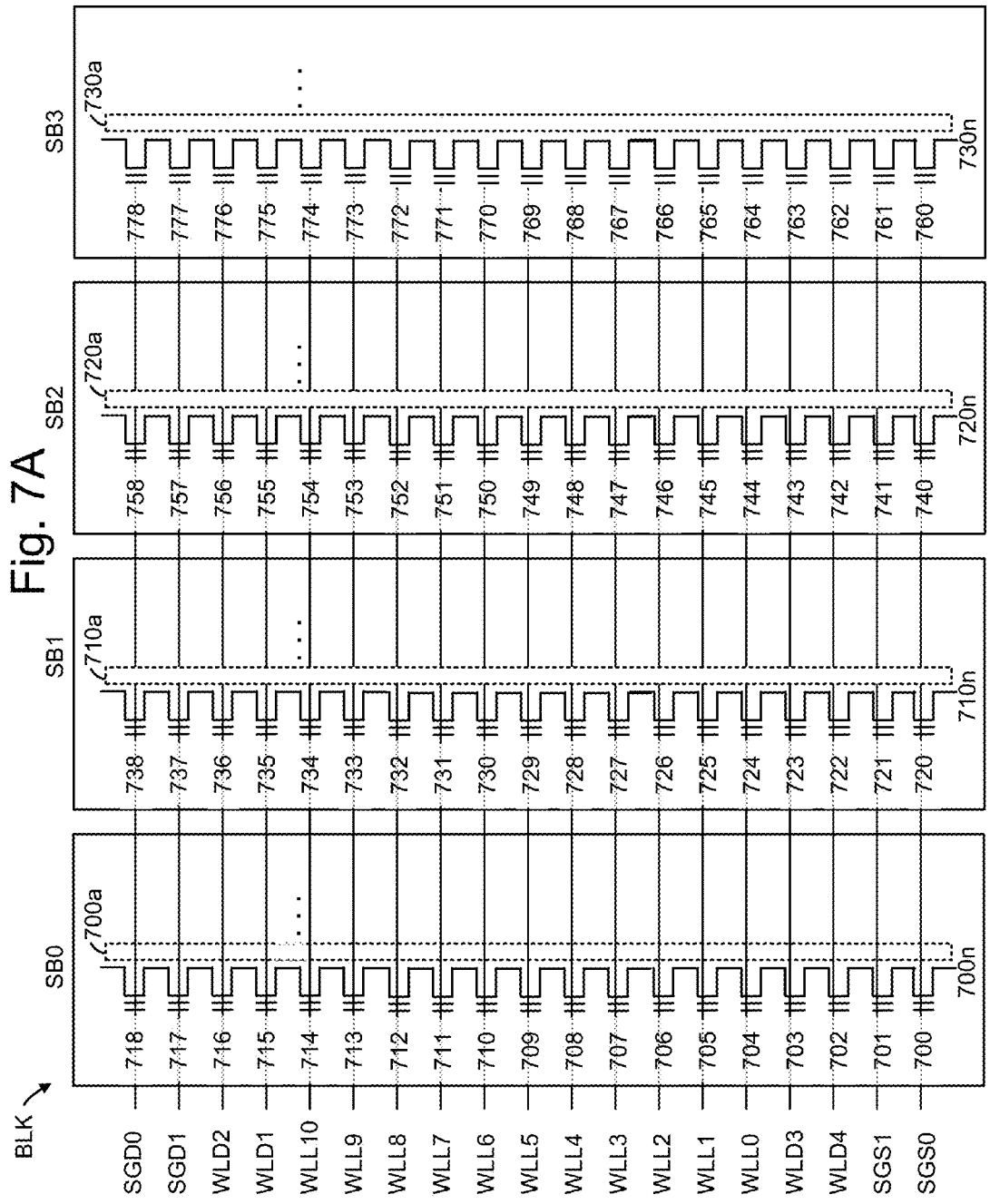

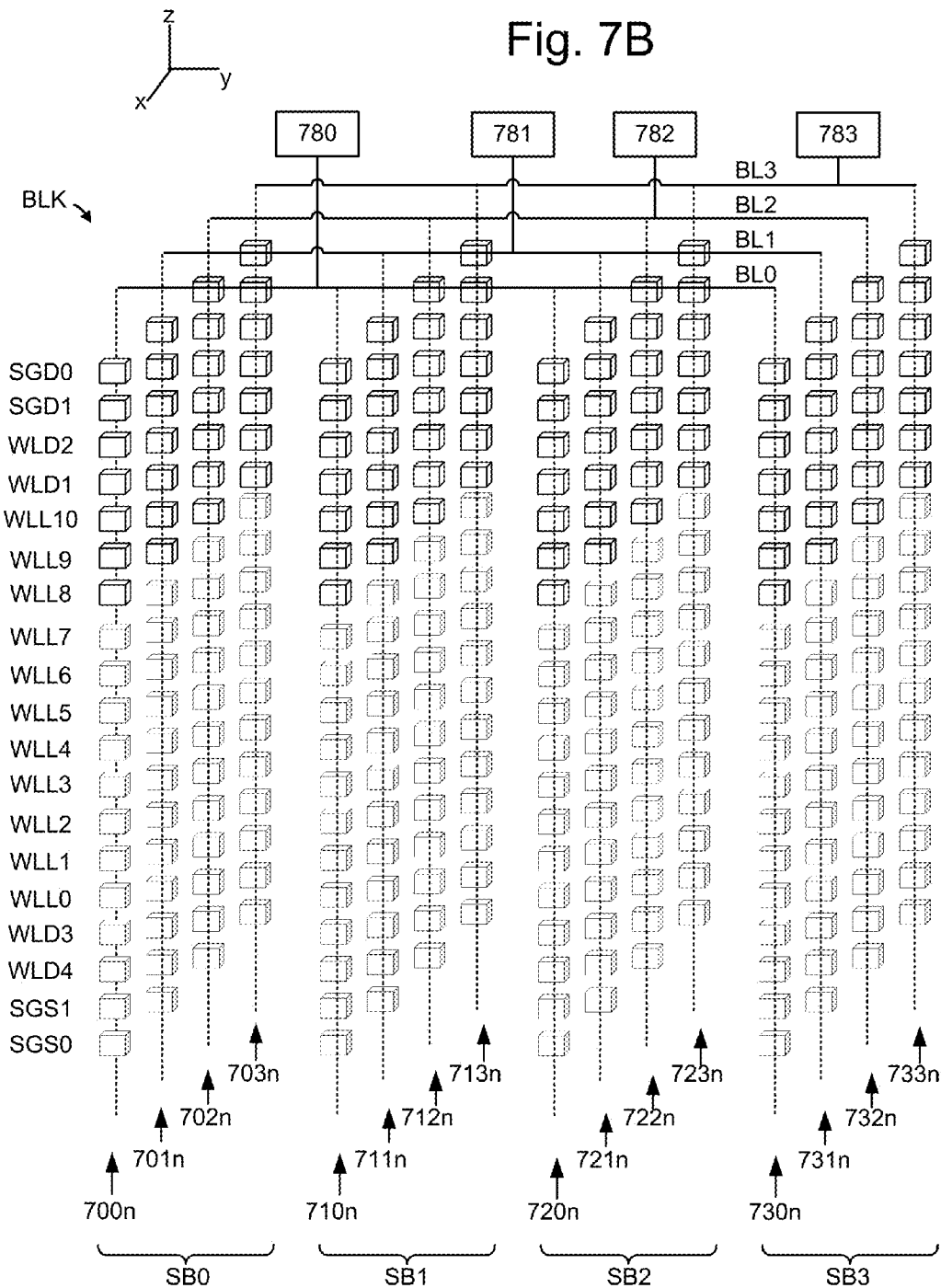

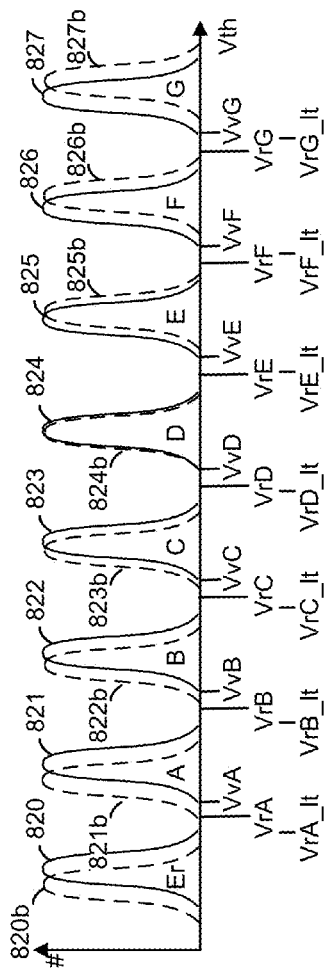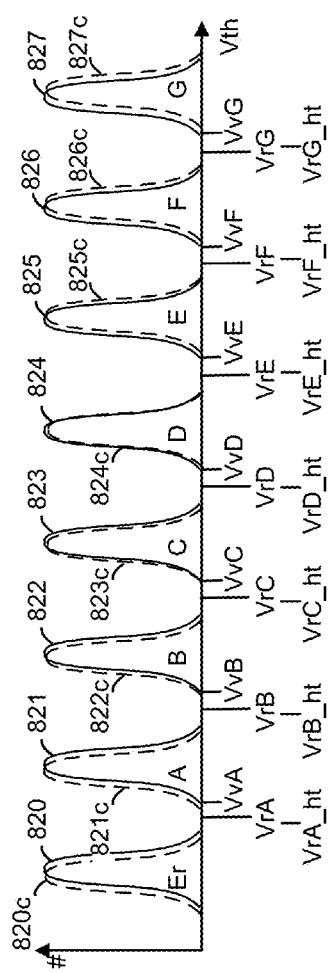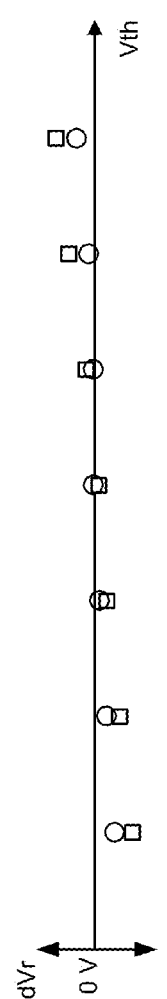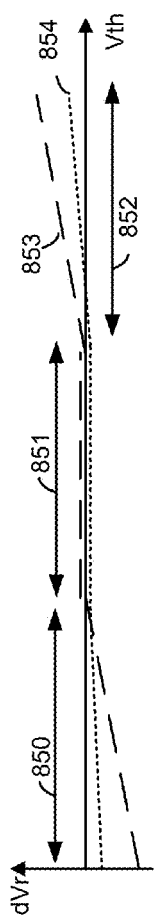

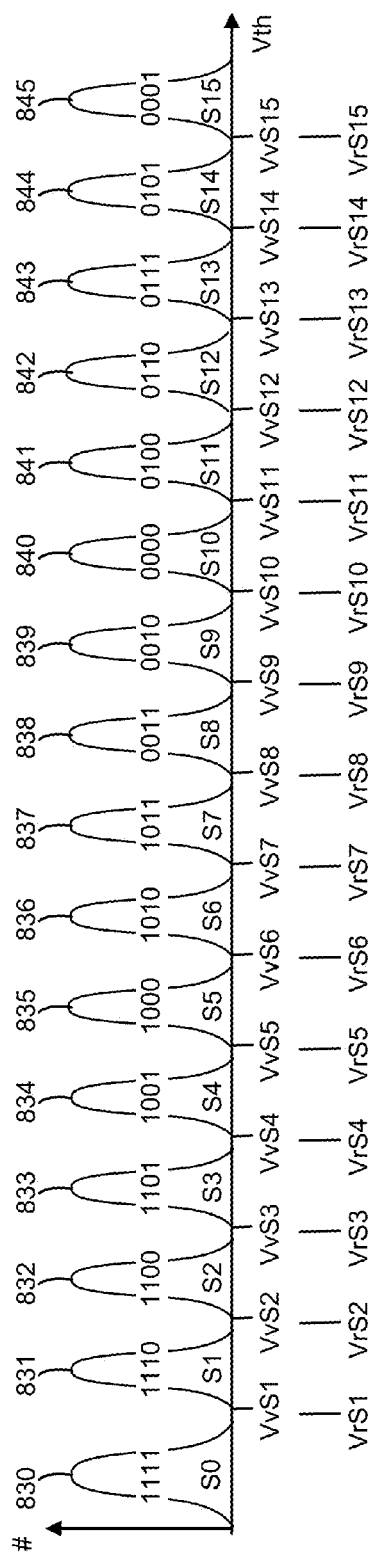
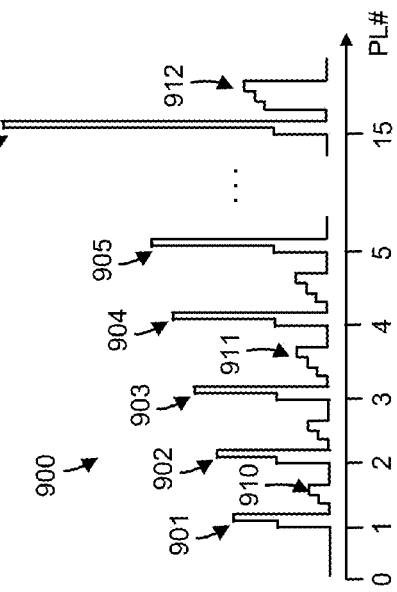

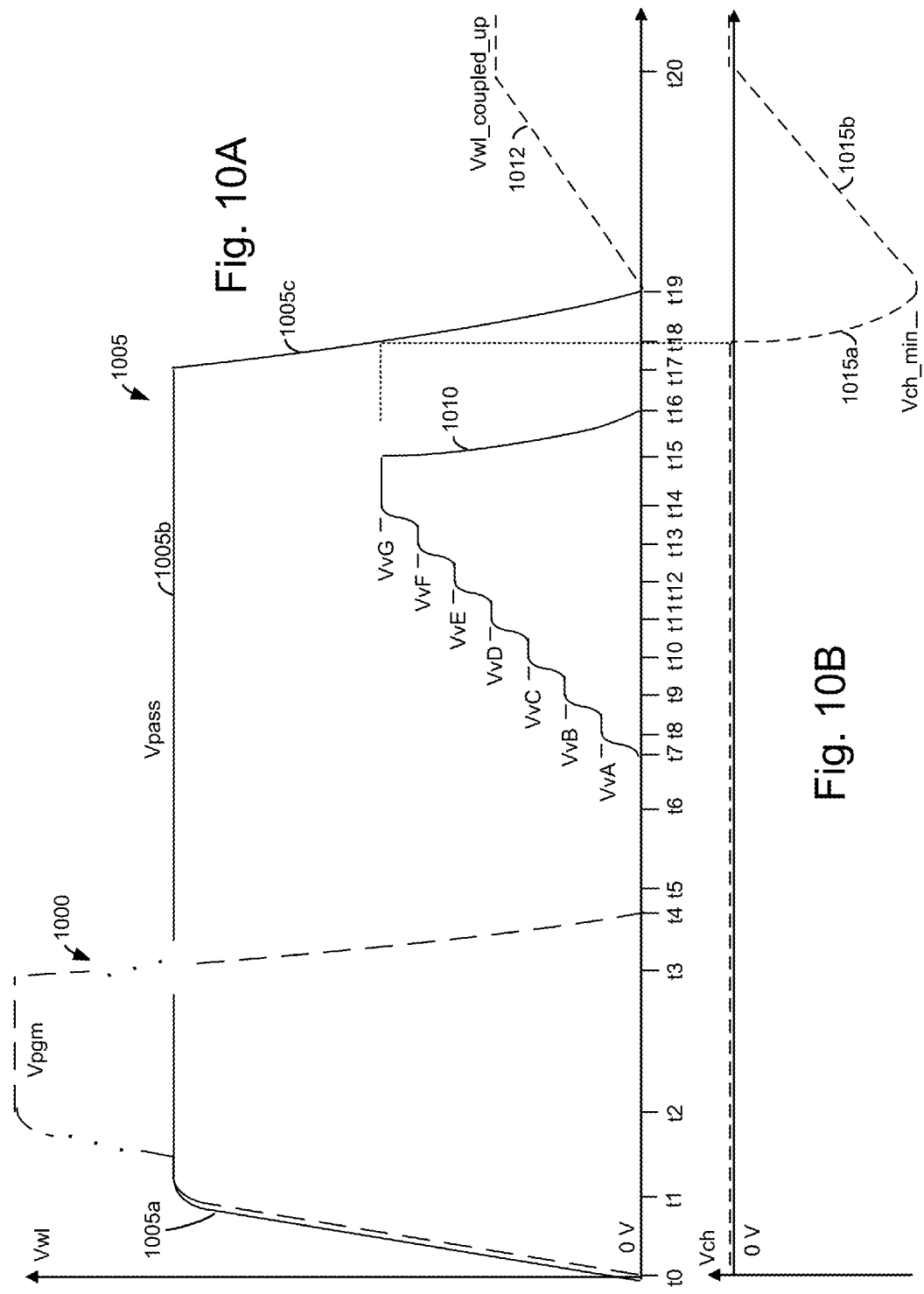

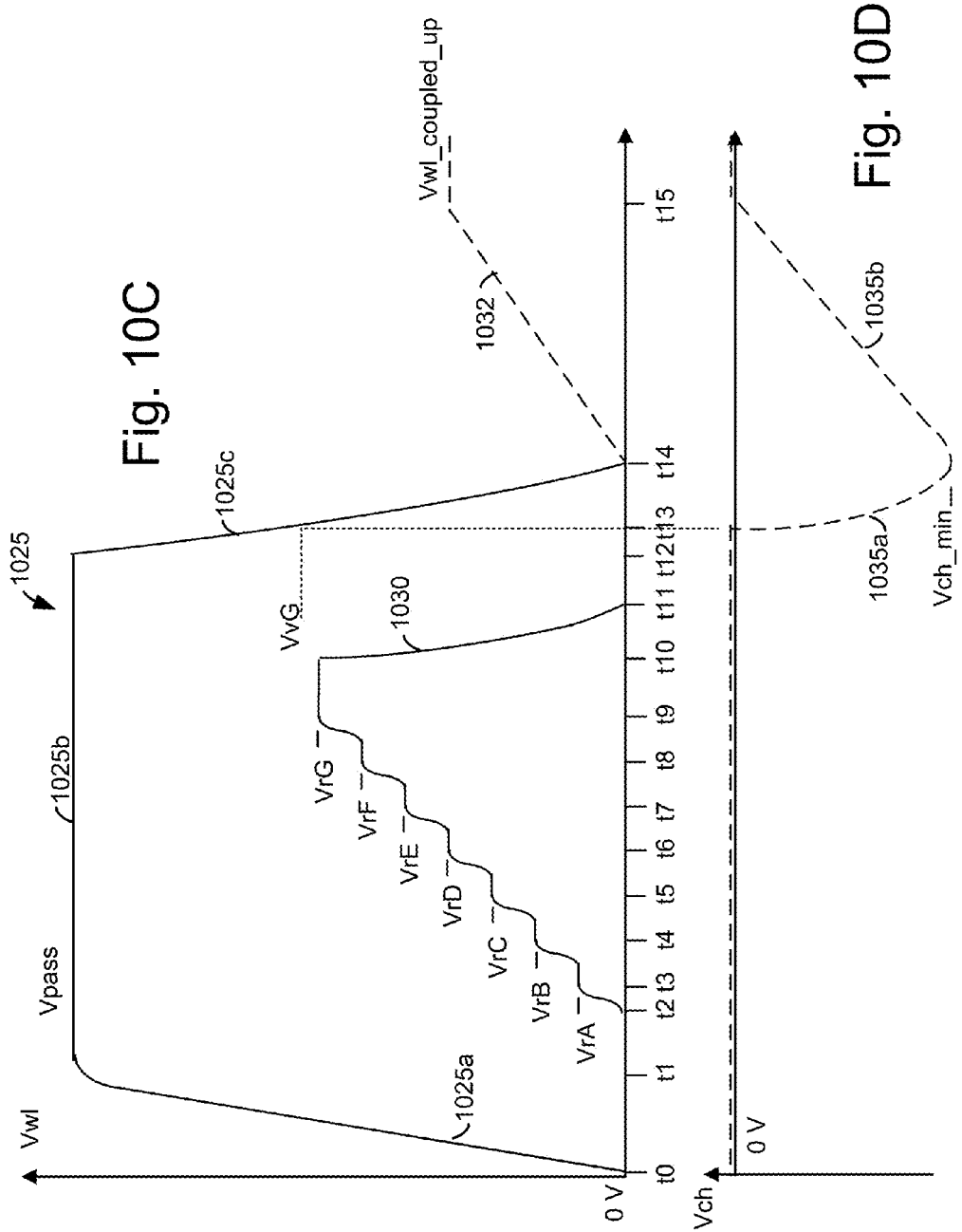

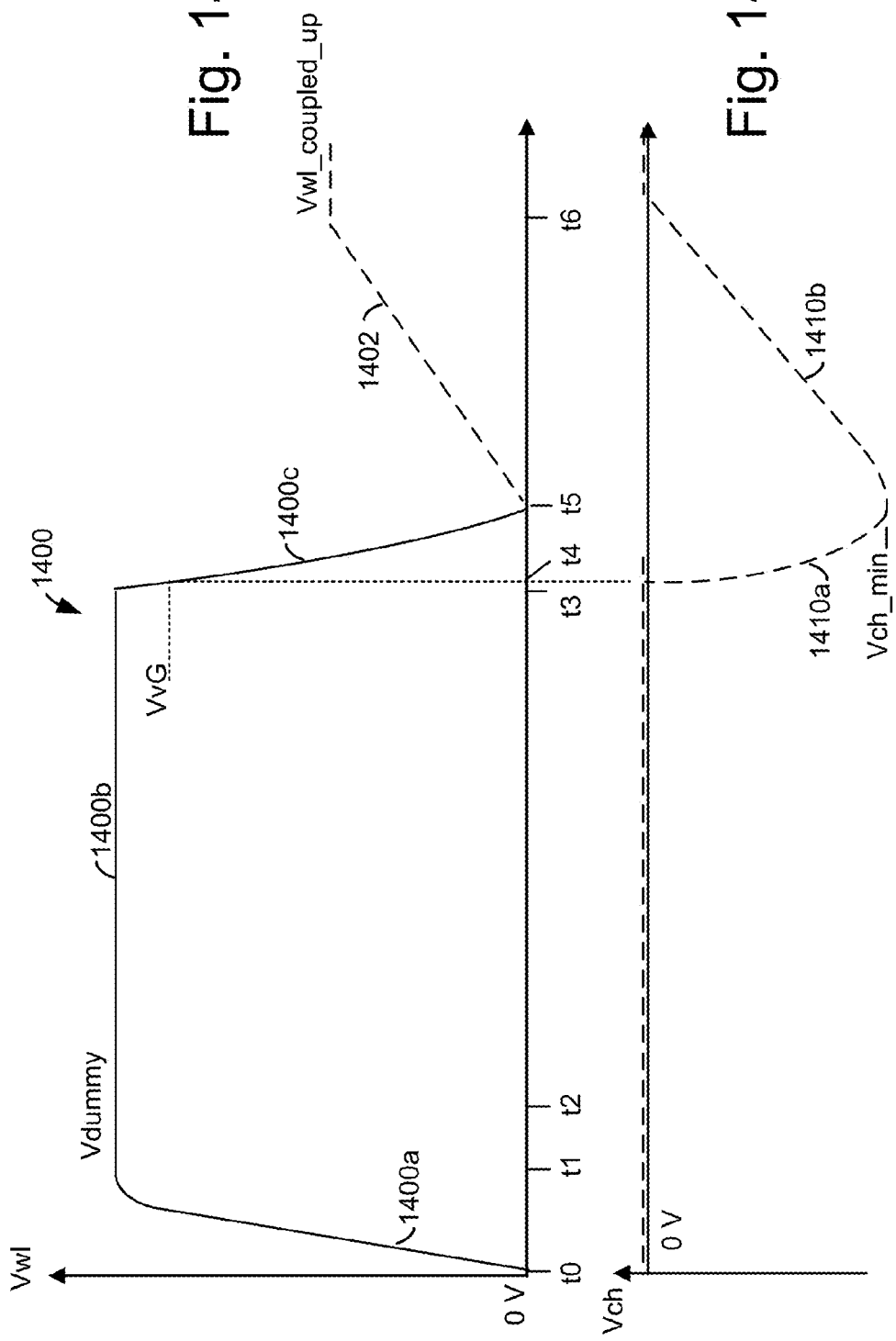

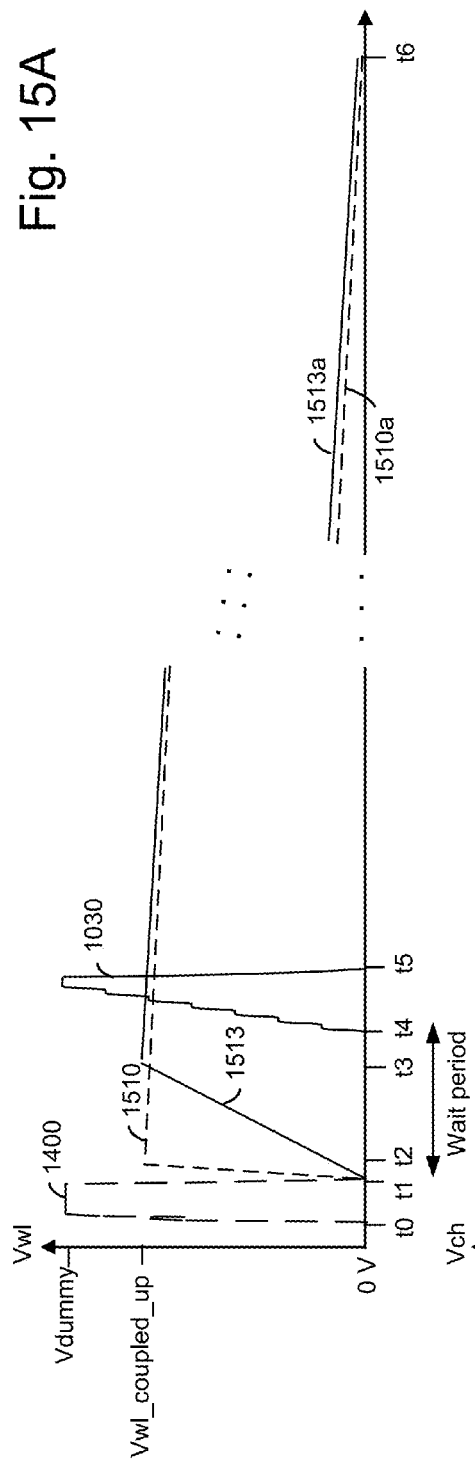
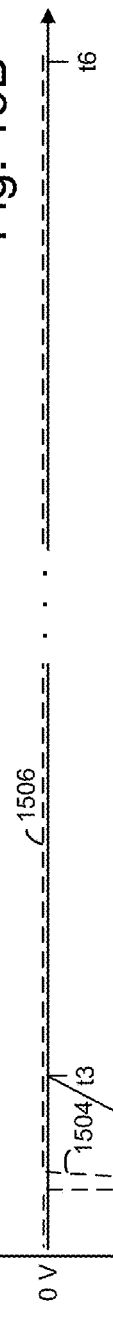
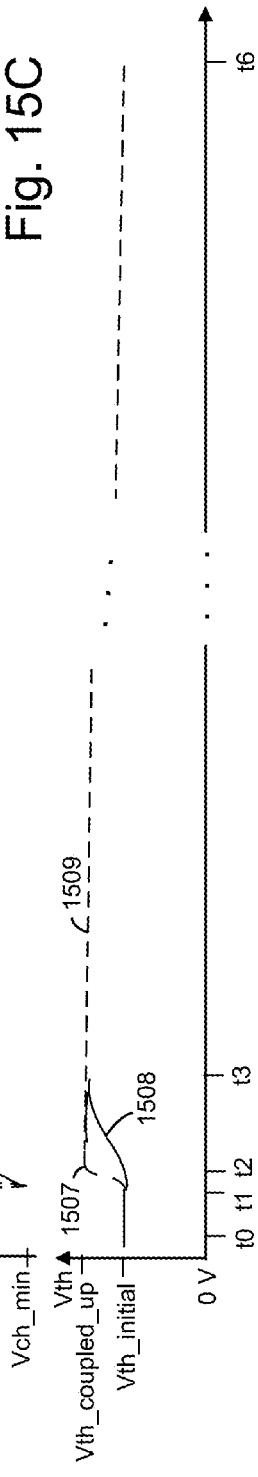
Fig. 15A
Fig. 15B
Fig. 15C

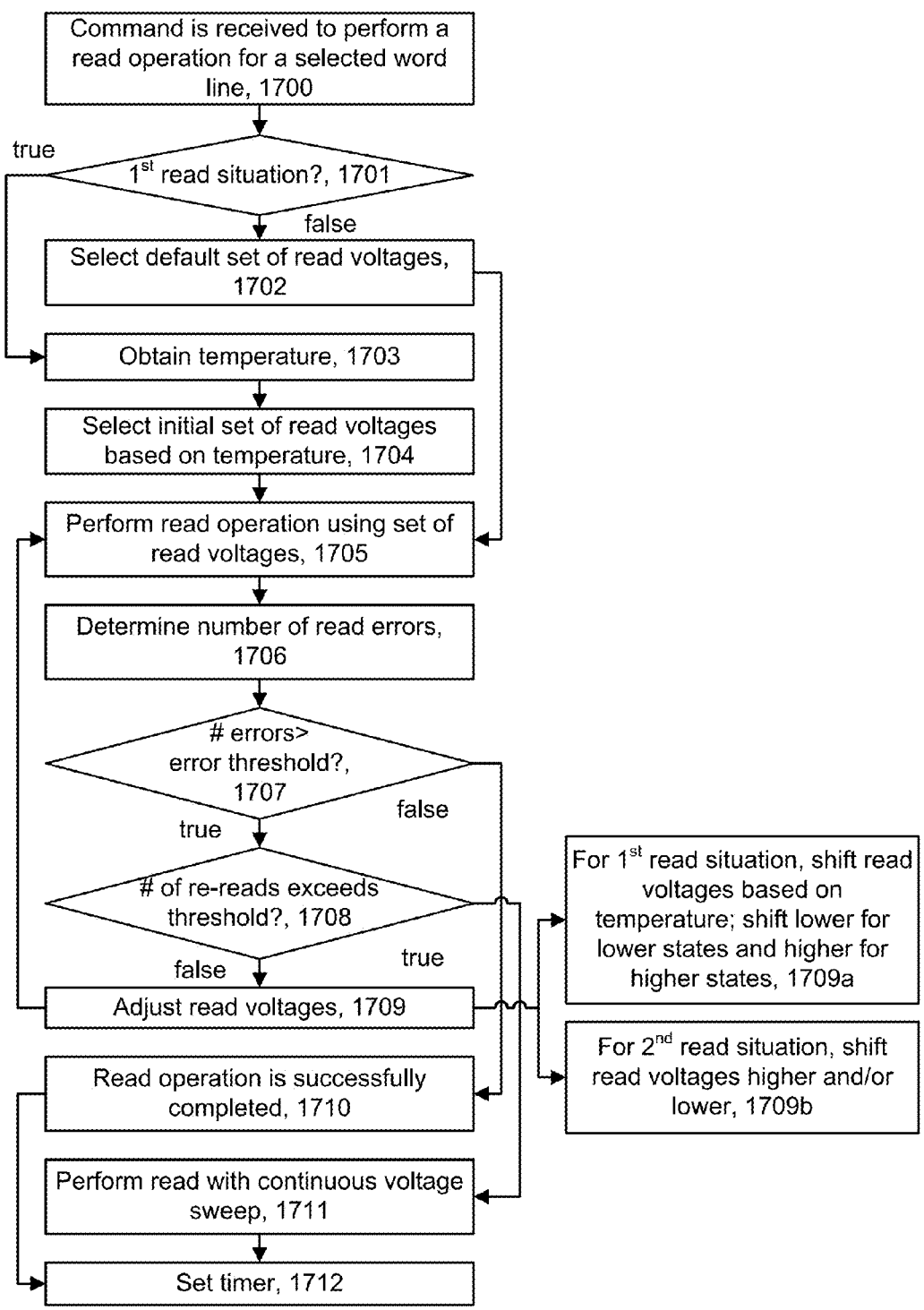

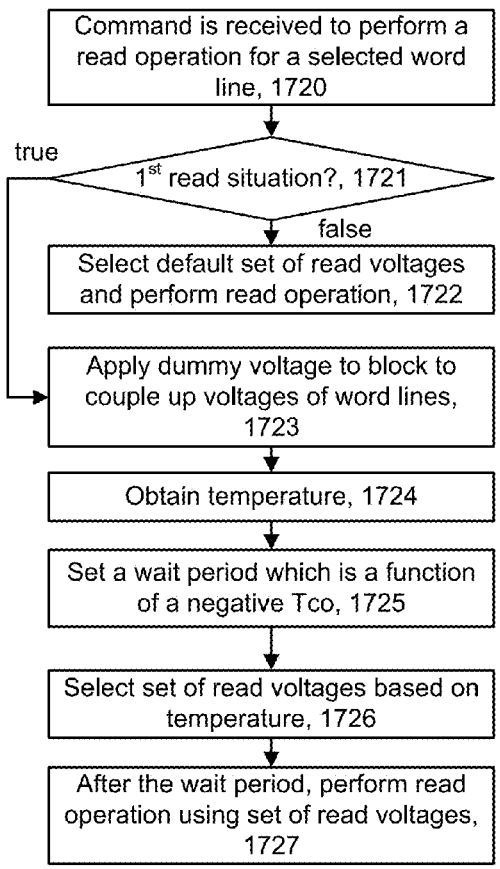
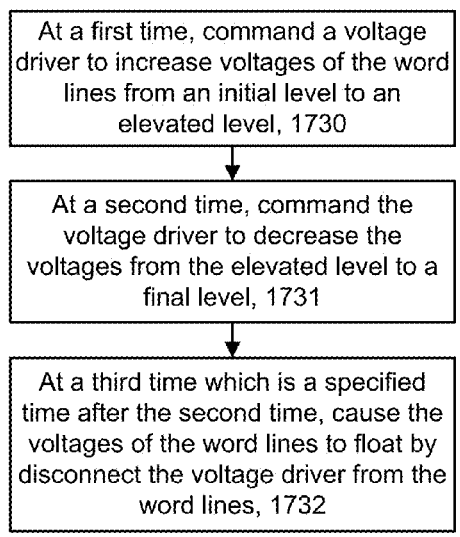
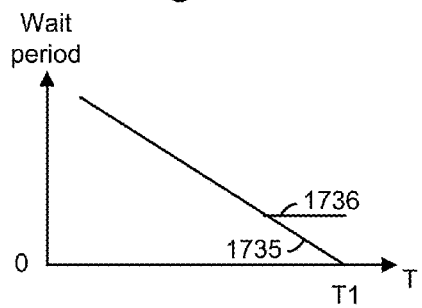
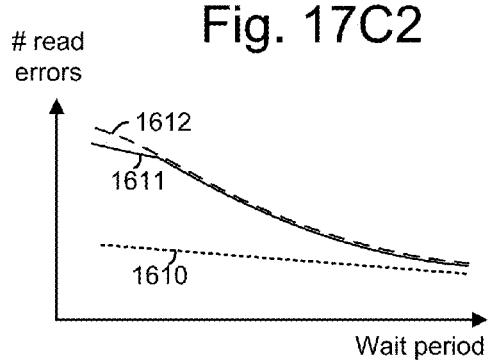

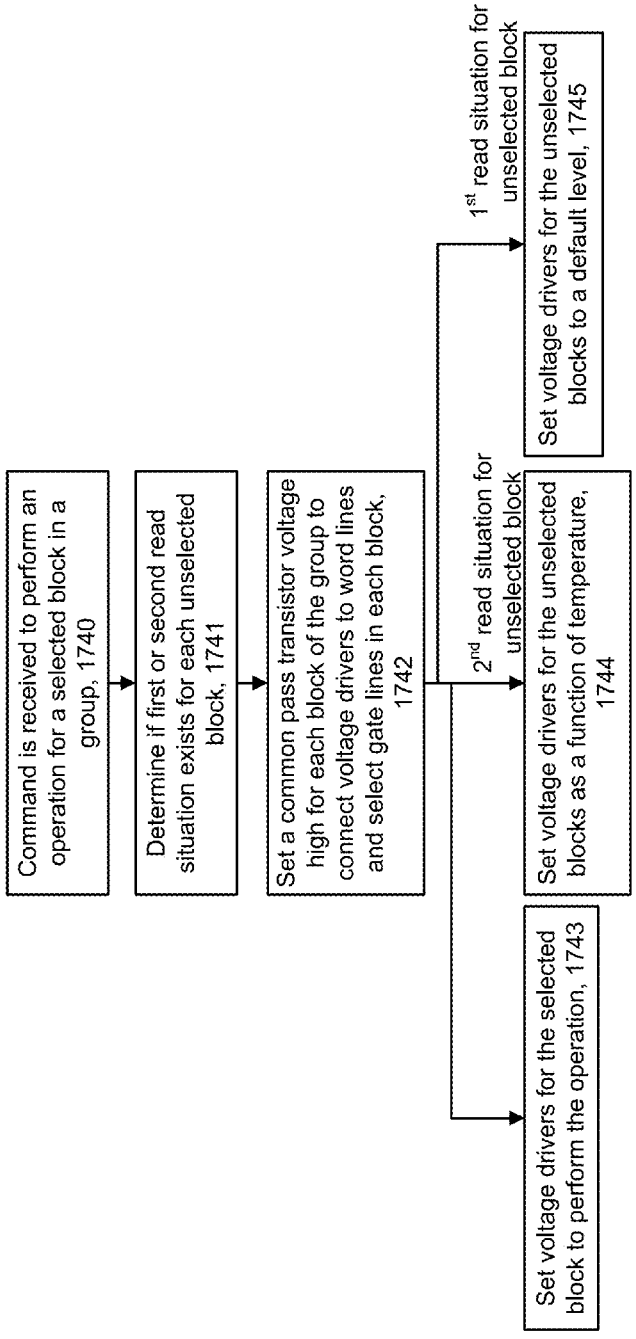
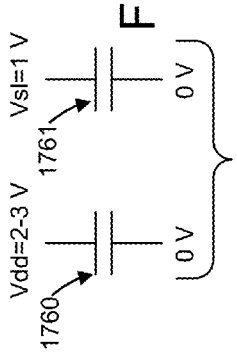
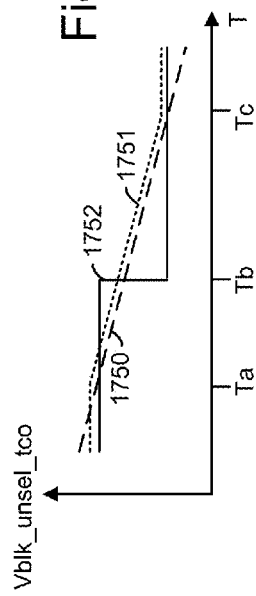

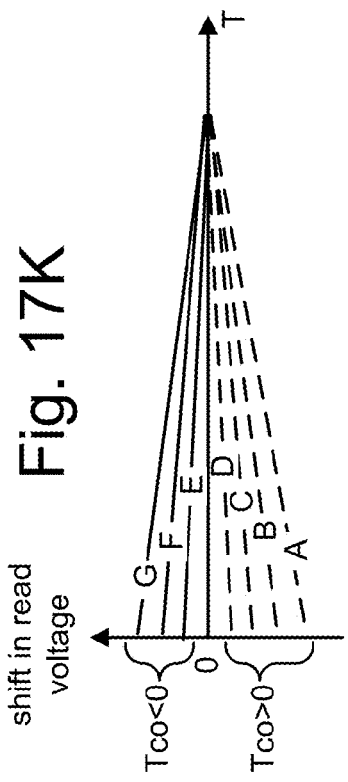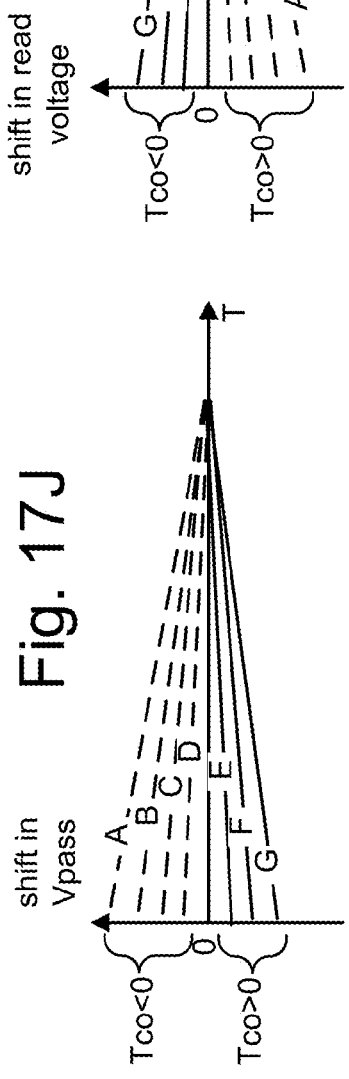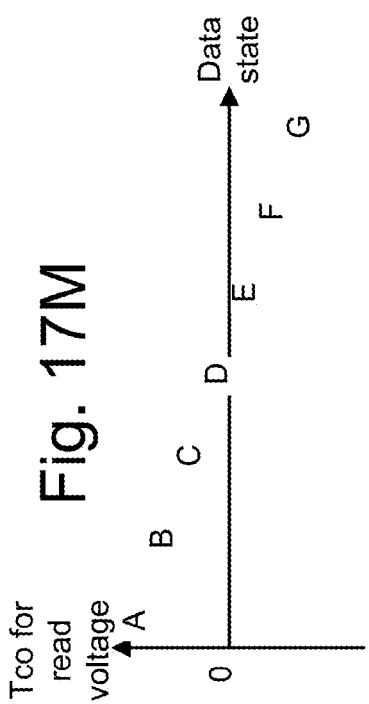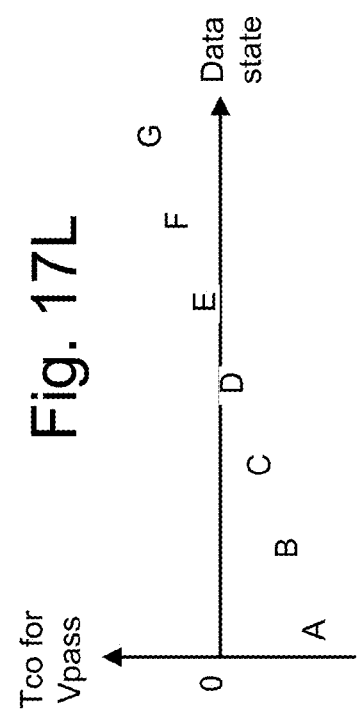

DYNAMIC TUNING OF FIRST READ COUNTERMEASURES

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 1A is a block diagram of an example memory device.

FIG. 7A depicts an example view of NAND strings in sub-blocks in a 3D configuration which is consistent with FIG. 4.

FIG. 7B depicts additional detail of the sub-blocks SB0-SB3 of FIG. 8A.

FIG. 8E depicts example Vth distributions of memory cells, where eight data states are used, and the Vth is lower for memory cells with lower data states and higher for memory cells with higher data states, when a first read situation is present compared to when a second read situation is present, and when a temperature is relatively low.

FIG. 8F depicts example Vth distributions of memory cells, where eight data states are used, and the Vth is lower for memory cells with lower data states and higher for memory cells with higher data states, when a first read situation is present compared to when a second read situation is present, and when a temperature is relatively low.

FIG. 8G depicts a plot of a shift in read voltage versus Vth, consistent with FIGS. 8E and 8F.

FIG. 8H depicts a general plot of a shift in read voltage versus Vth, for high and low temperatures and during a first read situation.

FIG. 8J depicts example Vth distributions of memory cells, where sixteen data states are used.

FIG. 9 depicts a waveform of an example programming operation.

FIG. 10A depicts a plot of example waveforms in a programming operation.

FIG. 10B depicts a plot of a channel voltage (Vch) corresponding to FIG. 10A.

FIG. 10C depicts a plot of example waveforms in a read operation.

FIG. 10D depicts a plot of a channel voltage (Vch) corresponding to FIG. 10C.

FIG. 14A depicts a plot of an example dummy voltage of a word line and a subsequent coupled up voltage of the word line.

FIG. 14B depicts a plot of a channel voltage which is coupled down from a starting level and subsequently returns to the starting level, consistent with FIG. 14A.

FIG. 15A depicts the dummy voltage plot 1400 of FIG. 14A followed by the read voltage 1030 of FIG. 10C, followed by a decay of the coupled up voltage of the word line over a longer time period.

FIG. 15B depicts a plot of a channel voltage which is coupled down from a starting level and subsequently returns to the starting level, consistent with FIG. 15A.

FIG. 15C depicts a plot of a Vth of a memory cell connected to the coupled up word line, consistent with FIGS. 15A and 15B.

FIG. 17A depicts an example implementation of the process of FIG. 16A, where initial read voltages and, optionally, additional read voltages for error recovery, are set based on temperature when a first read situation exists.

FIG. 17B depicts another example implementation of the process of FIG. 16A, where a dummy voltage is applied before read voltages when a first read situation exists, and a wait period between the dummy voltage and the read voltages is a function of temperature.

FIG. 17C1 depicts a plot of a wait period versus temperature (T), consistent with step 1725 of FIG. 17B.

FIG. 17C2 depicts a plot of a number of read errors versus a wait period between a dummy voltage and a read voltage waveform, for a lower page (plot 1610), a middle page (plot 1611) and an upper page (plot 1612).

FIG. 17D depicts an example implementation of step 1723 of FIG. 17B.

FIG. 17E depicts another example implementation of the process of FIG. 16A, where voltage drivers for an unselected block in a group of blocks provide voltages which are a function of temperature.

FIG. 17F depicts a plot of Vblk_unsel_tco (a voltage applied to word lines in an unselected block) versus temperature, consistent with step 1744 of FIG. 17E.

FIG. 17G depicts control gate and channel voltages on a memory cell which acts as a capacitor in an unselected block, consistent with steps 1744 and 1745 of FIG. 17E.

FIG. 17J depicts a shift in pass voltage versus temperature, consistent with FIG. 17I.

FIG. 17K depicts a shift in read voltage versus temperature, consistent with FIG. 8I.

FIG. 17L depicts a Tco for Vpass for the different data states of FIG. 17J.

FIG. 17M depicts a Tco for read voltage for the different data states of FIG. 17K.

DETAILED DESCRIPTION

Figure 1B:
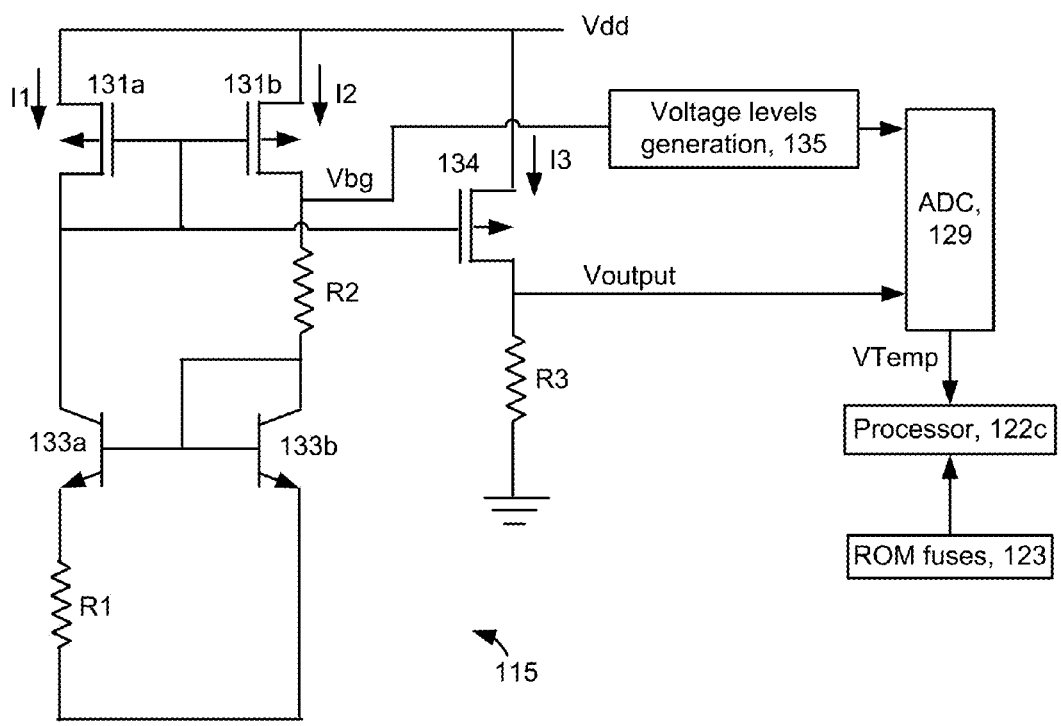
FIG. 1B depicts an example of the temperature-sensing circuit 115 of FIG. 1B.

Techniques are provided for improving the accuracy of read operations in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 8A). In a two-bit per cell memory device, there are four data states including the erased state and three higher data states referred to as the A, B and C data states (see FIG. 8B). In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8J) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, it has been observed that the Vth of a memory cell can vary depending on when the read operation occurs. For example, the Vth can vary in the memory cells depending on a coupled up state of the word lines when the read operation occurs. A "first read" can be defined in which the word lines are not coupled up, and a "second read" situation can be defined in which the word lines are coupled up.

The cells can be in the first read situation when the read occurs shortly after a power on event in the memory device. After a power on event, e.g., when the memory device is powered up for use, an operation may occur which checks for bad blocks. This operation involve applying 0 V or other low voltage to the word lines. As a result, any coupling up of the word line voltages is discharged.

The word lines can also be discharged in a block when the word line voltages are set to a low level when the block is inactive while an operation is performed in another block. The cells can also be in the first read situation after a significant amount of time, e.g., one hour, has passed after a last sensing operation, since the word line discharges over time. Since the word lines are not significantly coupled up while in the first read situation, there is little or no programming or erasing of the cells due to the word line voltage, so there is little or no shift in the Vth of the cells.

The cells can be in the second read situation, e.g., when the read occurs shortly, e.g., seconds or minutes, after a last sensing operation. Since the word lines are relatively strongly coupled up while in the second read situation, there is a programming or erasing of the cells due to the word line voltage, so there can be a significant shift in the Vth. In particular, the word lines with a coupled-up voltage can cause weak programming of cells which have a relatively low Vth, lower than the coupled-up voltage, e.g., cells in lower programmed data states, thus resulting in a Vth upshift for these cells. Also, there is weak erasing of cells which have a relatively high Vth, higher than the coupled-up voltage, e.g., cells in higher programmed data states, thus resulting in a Vth downshift for these cells. For the higher programmed data states, the coupling up potential of the channel to the word line is typically not strong enough to trap more electrons in the charge trapping layer of a cell. This is due to a screening effect of the electrons which are already present in the charge trapping layer of the cell and provide the high Vth. Instead, the electrons in the charge trapping layer are more attracted towards the control gate, resulting in a Vth downshift (e.g., when electrons move far away from the channel, Vth is reduced).

The cells gradually transition from the second read situation to the first read situation over time, e.g., one hour, as the word lines are discharged.

The coupling up of the word line voltage is caused by the voltages of a sensing operation such as a verify operation which occurs in connection with a programming operation, or a read operation which occurs after a programming operation is completed. The sensing of the cells involves the application of a sensing voltage (e.g., a read or verify voltage) to a selected word line. At the same time, a pass voltage is applied to the unselected word lines and then stepped down. This step down temporarily reduces a channel voltage due to capacitive coupling. When the channel voltage increases back to its nominal level, this causes an increase or coupling up of the word line voltages, also due to capacitive coupling. The Vth gradually decreases as electrons which are trapped in the charge trapping material of the cells are de-trapped and return to the channel, e.g., over a period of time such as one or more hours. See FIGS. 10A to 10D and 14A to 15C.

Since a programming operation includes sensing, a programming operation for one word line in a block results in the other word lines of the block entering the second read situation if they are not already in the second read situation.

The second read situation is more common than the first read situation since read operations frequently occur as the device is being used. Thus, the nominal read voltages are typically optimized for the second read situation. As a result, when the cells are read while in the first read situation, the Vth will be downshifted for the lower programmed states and upshifted for the higher programmed states. This can result in read errors. Furthermore, it has been observed that the amount of shift is a function of temperature such that the shift is greater when the temperature is lower. This can result in even more read errors when the temperature is lower.

Techniques provided herein address the above and other issues. In one aspect, read voltages are set and optimized based on whether a first read situation exists for a set of cells. If the first read situation exists, the read voltages are set based on temperature and are shifted relative to the nominal read voltages. Read voltages of the lower programmed data states are set according to a positive temperature coefficient (Tco) (lower temp→lower read voltage), and read voltages of the higher programmed data states are set according to a negative Tco (lower temp→higher read voltage). See FIG. 17M.

In another aspect, an error recovery process shifts the read voltage of a data state from an initial read voltage if the number of read errors is too high using an initial read voltage. The shift in the read voltage is a function of temperature such that the shift is relatively larger at relatively lower temperatures.

In another aspect, a dummy voltage is applied to the word lines before a read operation to provide the word lines in a coupled up state for the read operation. The dummy voltage mimics the sensing voltage of a program or read operation and therefore has the same couple up effect on the word lines. However, no sensing operation need be performed during the dummy voltage, so that time and power consumption penalties are minimized. The word line voltages are floated a specified time after the step down of the dummy voltage. Moreover, to allow sufficient time for the coupling up of the word lines, a wait period is imposed between the dummy voltage and the read voltages of the read operation. The wait period can be relatively larger at relatively lower temperatures.

In another aspect, the word line voltages of unselected blocks are set relatively higher at relatively lower temperatures, when an operation takes place in another block in a group of blocks which have a common control gate voltage for pass transistors of voltage drivers. This can prevent or reduce a Vth downshift in coupled up word lines of the unselected block. The word line voltages of an unselected block can also be set based on whether the block is in the first or second read situation.

In another aspect, pass voltages of unselected word lines are adjusted based on temperature during a read operation for cell in the first read situation. This can be done alternatively or additionally to the adjustment of read voltages. The direction of the adjustment to the pass voltages is opposite to the direction of adjustment of the read voltages.

Various other features and benefits are described below.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. The state machine may include a timer 112a to enforce a wait period after a dummy voltage, or to determine an elapsed time since a last sensing operation, as discussed further below. A storage region 113 may be provided, e.g., for voltages to be applied to word lines and select gates, as described further below, such as in read an error recovery operations.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIGS. 18A and 18B. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowcharts of FIG. 14A to 14E. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. The ECC engine may be used to count of number of errors in a read operation and use this number to determine whether to perform a coupling up of word lines, as discussed further below.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

The controller 122 may also include a temperature-sensing circuit 115 which is used by the processor 122c to set temperature-based parameters such as read voltages and other word line and select gate line voltages. For example, the controller may provide a digital signal to the power control module 116 to set a control gate voltage in response to a temperature indicated by an output of the temperature-compensation circuit. See also FIG. 1B.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
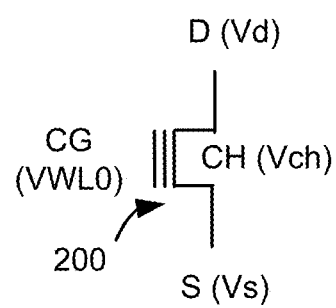
FIG. 2 depicts an example memory cell 200.

FIG. 2 depicts an example memory cell 200. The memory cell comprises a control gate CG which receives a word line voltage Vwll0, a drain at a voltage Vd, a source at a voltage Vs and a channel at a voltage Vch.

Figure 3:
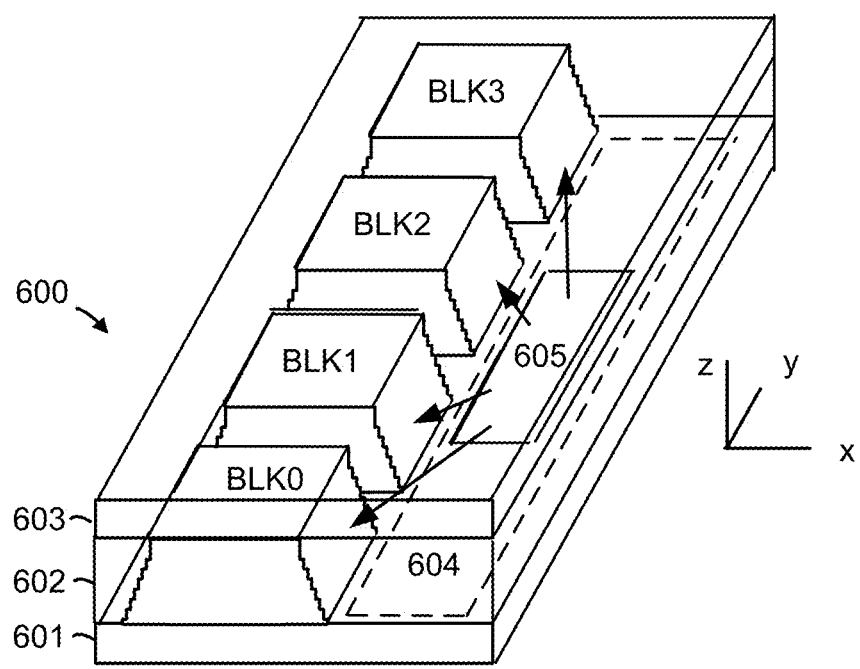
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
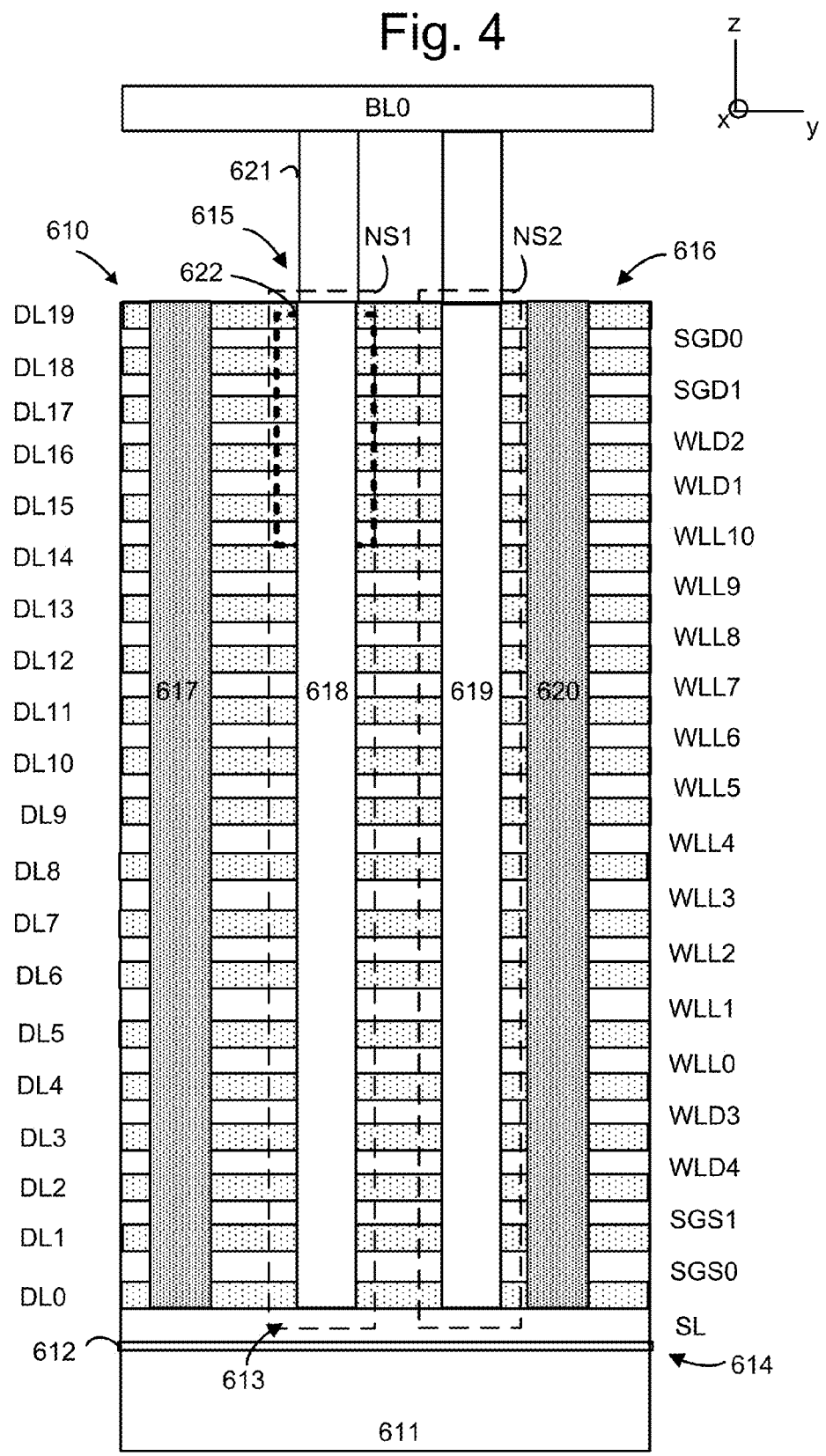
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 5:
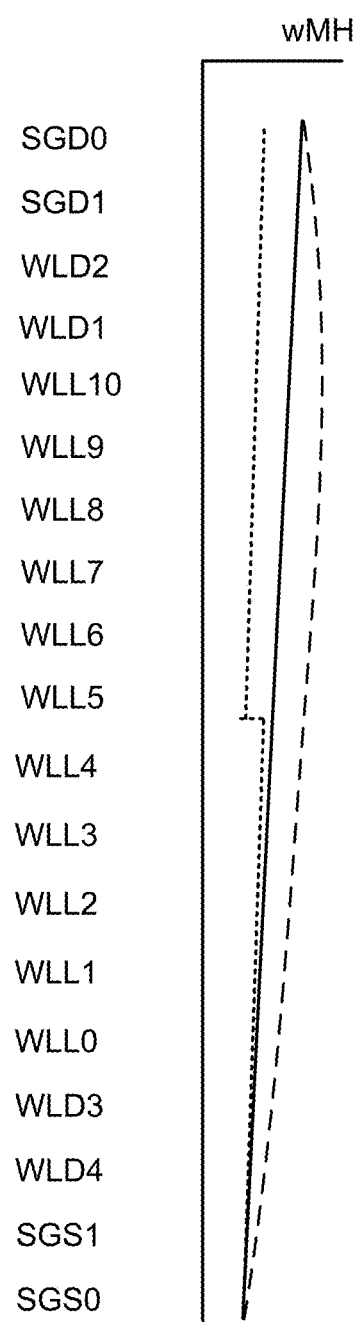
FIG. 5 depicts a plot of memory hole diameter in the stack of FIG. 4.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
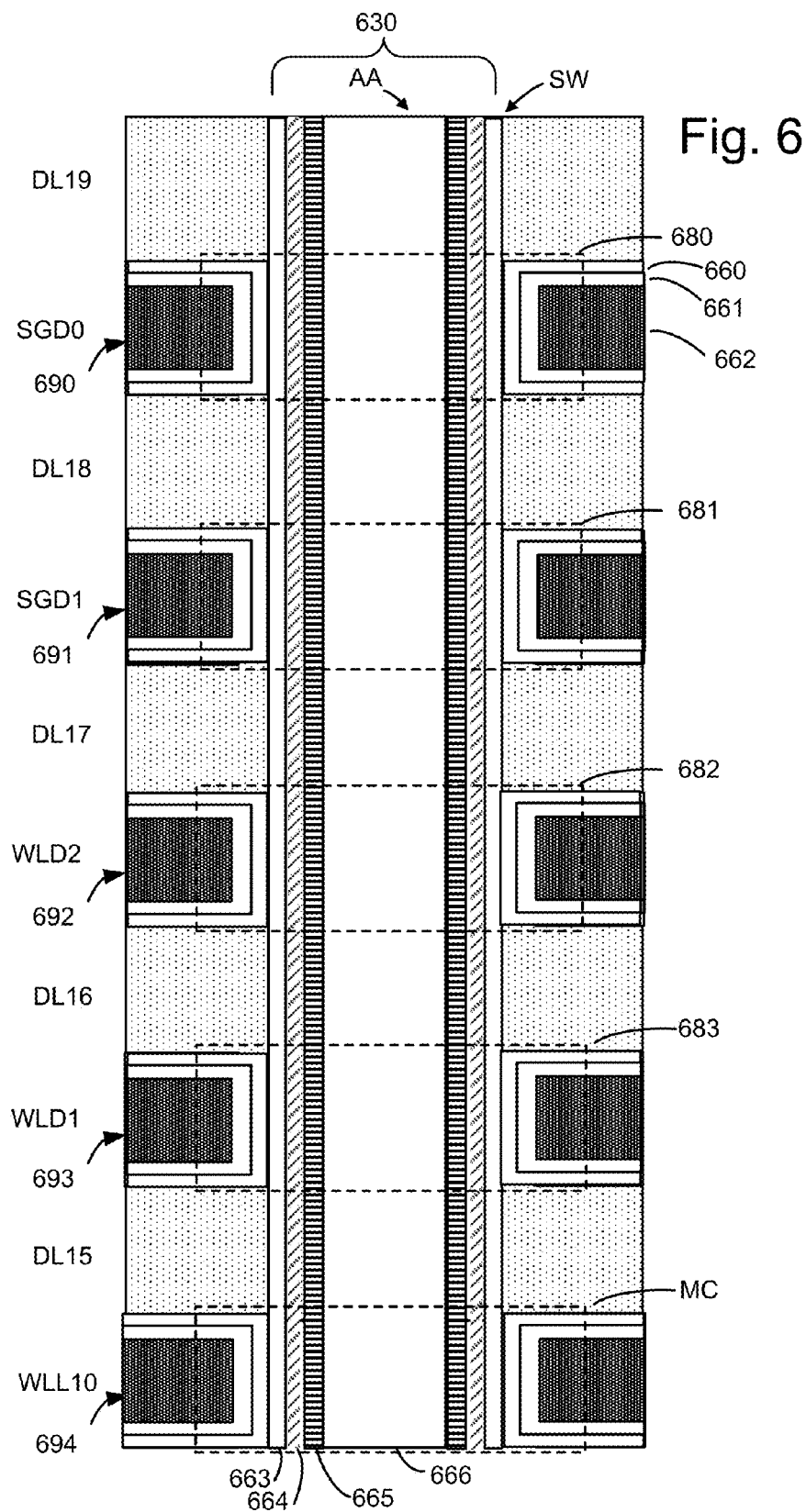
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as SiN or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channel regions 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

FIG. 7B depicts additional detail of the sub-blocks SB0-SB3 of FIG. 7A. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3.

Figure 8A:
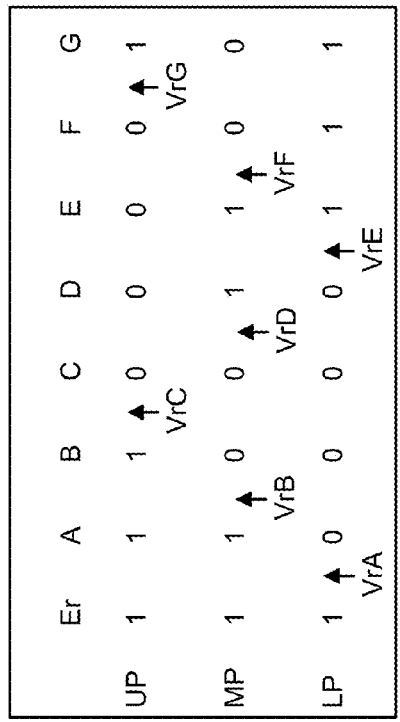
FIG. 8A depicts example Vth distributions of memory cells, where two data states are used.

FIG. 8A depicts example Vth distributions of memory cells, where two data states are used. During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

The Vth distributions 800 and 801 represent an erased state (Eslc) and a programmed data state (Pslc), respectively. Further, assume in this example that the cells have remained in the second read situation since the programming has completed so that the Vth distributions have not been shifted.

The erased state may represent a one bit while the programmed state represents a zero bit, for example. A verify voltage for the programmed state is VvSLC and a read voltage for distinguishing between the two states is VrSLC. Generally, a read voltage for distinguishing between adjacent states, e.g., a lower state and a higher state, should be located midway between the upper tail of the Vth distribution of the lower state and the lower tail of the Vth distribution of the higher state.

Figure 8B:
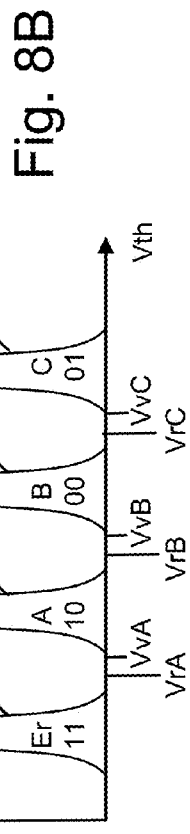
FIG. 8B depicts example Vth distributions of memory cells, where four data states are used.

FIG. 8B depicts example Vth distributions of memory cells, where four data states are used. The data states are represented by Vth distributions 810, 811, 812 and 813 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

Figure 8D:
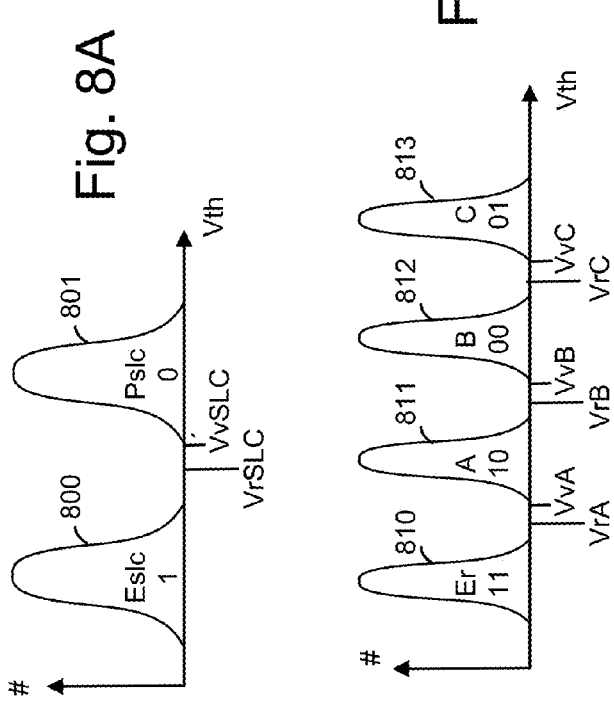
FIG. 8D depicts bit sequences for different data states and for lower, middle and upper pages of data, and associated read voltages.
Figure 8C:
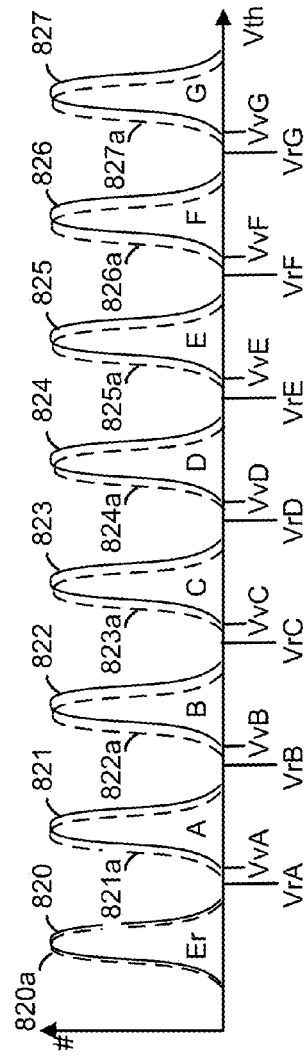
FIG. 8C depicts example Vth distributions of memory cells, where eight data states are used, and a downshift in Vth is observed for memory cells in an unselected block.

FIG. 8C depicts example Vth distributions of memory cells, where eight data states are used, and a downshift in Vth is observed for memory cells in an unselected block. For the Er, A, B, C, D, E, F and G states, we have Vth distributions 820, 821, 822, 823, 824, 825, 826 and 827, respectively. For the A, B, C, D, E, F and G states, we have verify voltages VvA, VvB, VvC, VvD, VvE, VvF and VvG, respectively, and read voltages VrA, VrB, VrC, VrD, VrE, VrF and VrG, respectively, and example encoding of bits of 111, 110, 100, 000, 010, 011, 001 and 101, respectively. The bit format is: UP/MP/LP.

Additionally, for the Er, A, B, C, D, E, F and G states, Vth distributions 820a, 821a, 822a, 823a, 824a, 825a, 826a and 827a, respectively, are downshifted distributions which are caused by discharge of the word line voltage, e.g., when a low voltage is applied to the word lines of a block by voltage drivers. This can occur when the block is unselected, as discussed, e.g., in connection with FIG. 17E. The Vth downshift may be higher for the higher states.

FIG. 8D depicts bit sequences for different data states and for lower, middle and upper pages of data, and associated read voltages. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG. See also FIG. 17C2, which describes read errors for different pages of data.

FIG. 8E depicts example Vth distributions of memory cells, where eight data states are used, and the Vth is lower for memory cells with lower data states and higher for memory cells with higher data states, when a first read situation is present compared to when a second read situation is present, and when a temperature is relatively low. As mentioned at the outset, the first read situation results in a Vth downshift for lower programmed data states and a Vth upshift for higher programmed data states.

For the Er, A, B, C, D, E, F and G states, we have Vth distributions 820, 821, 822, 823, 824, 825, 826 and 827, respectively, as in FIG. 8C, in the second read situation. For the first read situation, the Vth distributions 820b, 821b, 822b, 823b and 824b of the Er, A, B, C and D states, respectively, represent progressively larger Vth downshifts for the progressively lower programmed data states. The Vth distributions 825b, 826b and 827b of the E, F and G states, respectively, represent progressively larger Vth upshifts for the progressively higher programmed data states. For the first read situation at the low temperature, the read voltages are adjusted so that they are optimal. In particular, VrA, VrB, VrC and VrD are downshifted to VrA_lt, VrB_lt, VrC_lt and VrD_lt, respectively, and VrE, VrF and VrG are upshifted to VrE_lt, VrF_lt and VrG_lt, respectively. Optionally, the read voltages of one or more midrange data states are not adjusted for the first read situation. For example, VrD may be used in both the first and second read situations.

For the low temperature (lt) case, the shifts in read voltage are relatively large compared to the high temperature (ht) case of FIG. 8F. Accordingly, read voltages can be set optimally in the first read situation by considering the temperature. A low temperature could be room temperature, such as 25 C or less, while a high temperature could be 85 C, for instance. A low temperature can encompass a temperature range such as 0-40 C while a high temperature can encompass a temperature range such as 40-85 C. Other approaches are possible as well. A low temperature can be a temperature below a threshold temperature and a high temperature can be a temperature above the threshold temperature. One or more intermediate temperature ranges can also be defined. For intermediate temperatures, between the high and low temperatures, the read voltage can be modified to intermediate levels (between the read voltages of FIGS. 8E and 8F, for example) accordingly.

FIG. 8F depicts example Vth distributions of memory cells, where eight data states are used, and the Vth is lower for memory cells with lower data states and higher for memory cells with higher data states, when a first read situation is present compared to when a second read situation is present, and when a temperature is relatively low. For the Er, A, B, C, D, E, F and G states, we have Vth distributions 820, 821, 822, 823, 824, 825, 826 and 827, respectively, as in FIG. 8C, in the second read situation. For the first read situation, the Vth distributions 820c, 821c, 822c, 823c and 824c of the Er, A, B, C and D states, respectively, represent progressively larger Vth downshifts for the progressively lower programmed data states. The Vth distributions 825c, 826c and 827c of the E, F and G states, respectively, represent progressively larger Vth upshifts for the progressively higher programmed data states. For the first read situation at the high temperature, the read voltages are adjusted so that they are optimal. In particular, VrA, VrB, VrC and VrD are downshifted to VrA_ht, VrB_ht, VrC_ht and VrD_ht, respectively, and VrE, VrF and VrG are upshifted to VrE_ht, VrF_ht and VrG_ht, respectively. Optionally, the read voltages of one or more midrange data states are not adjusted for the first read situation. For example, VrD may be used in both the first and second read situations.

Since the shifts in read voltage are relatively large for the low temperature case compared to the high temperature case, VrA_lt<VrA_ht, VrB_lt<VrB_ht, VrC_lt<VrC_ht, VrD_lt<VrD_ht and VrE_lt>VrE_ht, VrF_lt>VrF_ht and VrG_lt>VrG_ht.

FIG. 8G depicts a plot of a shift in read voltage (dVr) versus Vth, consistent with FIGS. 8E and 8F. The squares represent the low temperature case and the circles represent the high temperature case. The shifts in read voltage are relatively large for the low temperature case compared to the high temperature case. Further, the downshift in read voltage is relatively larger for lower programmed data states and the upshift in read voltage is relatively larger for higher programmed data states. Among the programmed data states, the largest downshift in read voltage is for the lowest programmed data state, e.g., the A state, and the largest upshift in read voltage is for the highest programmed data state, e.g., the G state.

FIG. 8H depicts a general plot of a shift in read voltage (dVr) versus Vth, for high and low temperatures and during a first read situation. As mentioned, in a first read situation, a Vth downshift may be seen for lower states represented by a Vth range 850, essentially no change in Vth may be seen in midrange states represented by a Vth range 851, and a Vth upshift may be seen for upper states represented by a Vth range 852. These shifts are relative to Vth levels in the second read situation. Further, plot 854 represents the read voltage shift for lower temperatures while plot 853 represents the read voltage shift for higher temperatures.

Figure 8I:
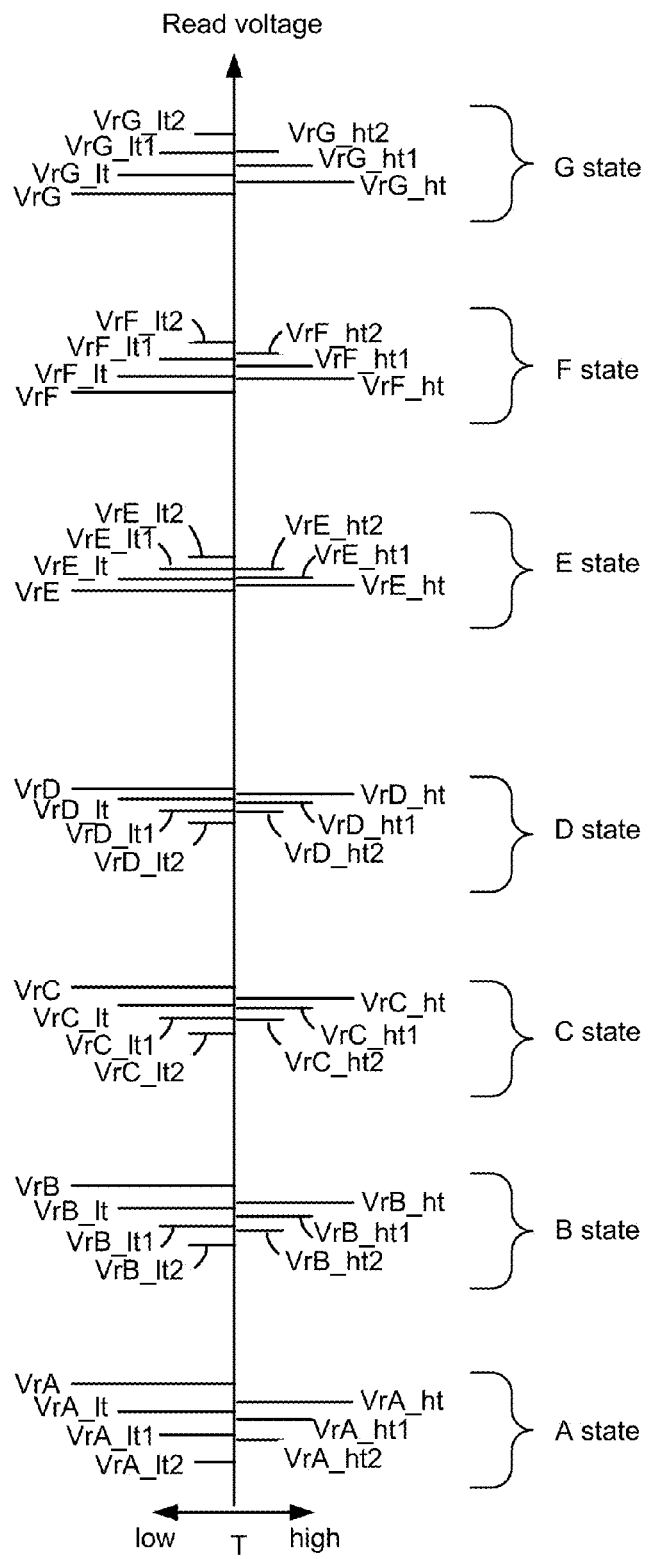
FIG. 8I depicts a plot of read voltages for a memory device in which eight data states are used, where read voltages are provided for high and low temperatures, for firsts and second read situations, and for initial read operations and error recovery read operations.

FIG. 8I depicts a plot of read voltages for a memory device in which eight data states are used, where read voltages are provided for high and low temperatures, for firsts and second read situations, and for initial read operations and error recovery read operations. The read voltage increases along the vertical axis. The hash marks on the left side of the vertical line are for use with a low temperature and the hash marks on the right side of the vertical line are for use with a high temperature. Further, sets of hash marks are associated with data states A-G as depicted.

For a second read situation, the read voltages are VrA, VrB, VrC, VrD, VrE, VrF and VrG for the A, B, C, D, E, F and G states, respectively. This could be independent of temperature, for example.

For a first read situation, with a low temperature, the initial read voltages are VrA_lt, VrB_lt, VrC_lt, VrD_lt, VrE_lt, VrF_lt and VrG_lt for the A, B, C, D, E, F and G states, respectively, as in FIG. 8E. If a first additional read is performed, such as in an error recovery operation consistent with FIG. 17A, first adjusted read voltages of VrA_lt1, VrB_lt1, VrC_lt1, VrD_lt1, VrE_lt1, VrF_lt1 and VrG_lt1 for the A, B, C, D, E, F and G states, respectively, can be used. If a second additional read is performed in the error recovery operation, second adjusted read voltages of VrA_lt2, VrB_lt2, VrC_lt2, VrD_lt2, VrE_lt2, VrF_lt2 and VrG_lt2 for the A, B, C, D, E, F and G states, respectively, can be used. In one approach, equal Vth shifts are used for each additional read operation of the error recovery process, for a given state. That is, for the A state, for instance, VrA_lt−VrA_lt1=VrA_lt1−VrA_lt2. These shifts can be different than VrA−VrA_lt. For the G state, for instance, VrG_lt1−VrG_lt=VrG_lt2−VrG_lt1. These shifts can be different than VrG_lt−VrG.

For a first read situation, with a high temperature, the initial read voltages are VrA_ht, VrB_ht, VrC_ht, VrD_ht, VrE_ht, VrF_ht and VrG_ht for the A, B, C, D, E, F and G states, respectively, as in FIG. 8E. If a first additional read is performed, such as in an error recovery operation consistent with FIG. 17A, first adjusted read voltages of VrA_ht1, VrB_ht1, VrC_ht1, VrD_ht1, VrE_ht1, VrF_ht1 and VrG_ht1 for the A, B, C, D, E, F and G states, respectively, can be used. If a second additional read is performed in the error recovery operation, second adjusted read voltages of VrA_ht2, VrB_ht2, VrC_ht2, VrD_ht2, VrE_ht2, VrF_ht2 and VrG_ht2 for the A, B, C, D, E, F and G states, respectively, can be used. In one approach, equal Vth shifts are used for each additional read operation, for a given state. That is, for the A state, for instance, VrA_ht−VrA_ht1=VrA_ht1−VrA_ht2. These shifts can be different than VrA−VrA_ht. For the G state, for instance, VrG_ht1−VrG_ht=VrG_ht2−VrG_ht1. These shifts can be different than VrG_ht−VrG. See also FIG. 17K.

FIG. 8J depicts example Vth distributions of memory cells, where sixteen data states are used. Programming using four bits per cell (16 levels) can involve lower, lower-middle, upper-middle and upper pages. The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15. The read voltages can be adjusted for a first read situation as discussed for the eight-state case.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 8A-8D.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

FIG. 10A depicts a plot of example waveforms in a programming operation. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. A pass voltage 1005 is applied to the unselected word lines from t5-t19 and reaches a magnitude of Vpass, which is sufficiently high to provide the cells in a conductive state so that the sensing (e.g., verify) operations can occur for the cells of the selected word line. The pass voltage includes an increasing portion 1005a, a fixed amplitude portion 1005b, for instance, at Vpass and a decreasing portion 1005c. The program voltage can temporarily pause at an intermediate level such as Vpass to avoid a single large transition which can have undesired coupling effects. Optionally, the pass voltage may be increased sooner so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The waveform decreases from VvG to 0 V or other steady state level from t15-t16.

For the unselected word lines, the decrease in Vpass will cause the cells to transition from a conductive state to a non-conductive state. In particular, when the Vpass falls below the Vth of a cell, the channel of the cell will become cutoff, e.g., the cell will become non-conductive. The dotted line at t18 indicates when a cell with Vth=VvG becomes non-conductive. When a cell becomes non-conductive, it acts as a capacitor in which the control gate is one plate and the channel is another plate. As the pass voltage 1005 decreases from VvG to 0 V, the channel is capacitively coupled down by a similar amount, as represented by a dashed line 1015a in FIG. 10B.

The plot 1012 is shown increasing relatively quickly but this is not to scale. In practice, the read operation, e.g., from t5-t19, may consume about 100 microseconds, while the coupling up of the word line may be significantly longer, in the millisecond range such as 10 milliseconds.

FIG. 10B depicts a plot of a channel voltage (Vch) corresponding to FIG. 10A. The channel is capacitively coupled down to a minimum level of Vch_min from t18-t19 and then begins to return to its original, starting level of, e.g., 0 V from t19-t20. The voltages of the word lines are allowed to float starting at t19, so that the voltages (plot 1012) are capacitively coupled higher by the increase in Vch (plot 1015b). The voltages of the word lines float to a peak level of Vwl_coupled_up. For example, VvG may be 5 V, so that there is a 5 V change in the word line voltage, e.g., 5-0 V, which is coupled to the channel. Vch_min may be about −5 V in this example. There is a 5 V increase in Vch which is coupled to the word line, e.g., control gate, of the cells. Vwl_coupled_up may be about 4 V.

FIG. 10C depicts a plot of example waveforms in a read operation. A read operation is similar to a verify operation as both are sensing operations and both provide a coupling up of the word lines. The horizontal axis depicts time and the vertical axis depicts word line voltage, Vwl. A pass voltage 1025 is applied to the unselected word lines from t0-t14 and reaches a magnitude of Vpass. The pass voltage includes an increasing portion 1025a, a portion 1025b at Vpass and a decreasing portion 1025c. A read voltage 1030 is applied to the selected word line. In this example, all seven read voltages are applied, one after another. An eight-level memory device is used in this example. Read voltages of VrA, VrB, VrC, VrD, VrE, VrF and VrG are applied at t3, t4, t5, t6, t7, t8 and t9, respectively. The waveform decreases from VrG to 0 V from t10-t11.

For the unselected word lines, the decrease in Vpass will cause the cells to transition from a conductive state to a non-conductive state, as discussed. The dotted line at t13 indicates when a cell with Vth=VvG becomes non-conductive. As the pass voltage 1025 decreases from VvG to 0 V, the channel is capacitively coupled down by a similar amount, as represented by a dashed line 1035a in FIG. 10D.

FIG. 10D depicts a plot of a channel voltage (Vch) corresponding to FIG. 10C. The channel is capacitively coupled down to a minimum level of Vch_min from t13-t14 and then begins to return to its original, starting level of, e.g., 0 V from t14-t15. The voltages of the word lines are allowed to float starting at t14, so that the voltages (plot 1032) are capacitively coupled higher by the increase in Vch (plot 1035b). The voltages of the word lines float to a peak level of Vwl_coupled_up, as discussed.

Figure 11:
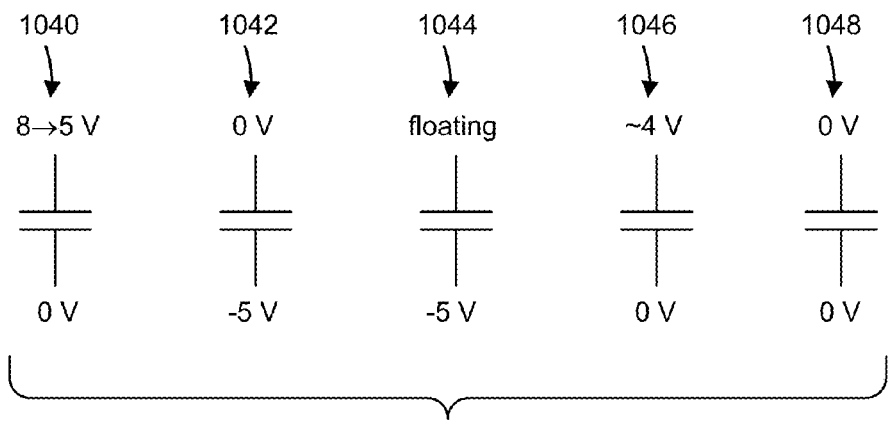
FIG. 11 depicts control gate and channel voltages on a memory cell which acts as a capacitor when the control gate voltage is decreased in a sensing operation.

FIG. 11 depicts control gate and channel voltages on a memory cell which acts as a capacitor when the control gate voltage is decreased in a sensing operation. As mentioned, the top plate represents the control gate or word line and the bottom plate represents the channel. The capacitor 1040 represents a memory cell in the time period of t17-t18 in FIG. 10A or t12-t13 in FIG. 10C, where Vpass=8 V and VvG=5 V. The word line voltage transitions from 8 to 5 V and Vch=0 V. The capacitor 1042 represents a memory cell at t19 in FIG. 10B or t14 in FIG. 10B2. Vwl=0 V and Vch=−5 V. The capacitor 1044 represents a memory cell just after t19 in FIG. 10A or just after t14 in FIG. 10C. Vwl floats and Vch=−5 V. The capacitor 1046 represents a memory cell after t20 in FIG. 10A or after t15 in FIG. 10C. Vwl=4 V and Vch=0 V. Here, the word line is in a maximum coupled up state. If the Vth of the memory cell is less than 4 V, the memory cell will be weakly programmed so that its Vth increases. If the Vth of the memory cell is more than 4 V, the memory cell will be weakly erased so that its Vth decreases. The capacitor 1048 represents a memory cell after a significant amount of time has passed, e.g., an hour or more. Vwl=0 V and Vch=0 V. See t6 in FIG. 15A.

When a data word line voltage floats, the amount of holes needed to charge up the channel is relatively small. As a result, the selected word line can be relatively quickly coupled up to about 4 V, for example. The potential on the selected word line remains at ~4 V for a while, attracting electrons trapped in the tunnel oxide-nitride-oxide (ONO) layers and causing a Vth up-shift. If the wait before the next read operation is long enough, the coupled up potential of the word line will be discharged, and the trapped electrons will be de-trapped. The first read situation will occur again, resulting in an elevated number of read errors if a corrective action is not taken, such as periodically applying a dummy voltage which simulates the word line coupling up effects of a sensing operation, and/or adjusting the read voltages.

Figure 12:
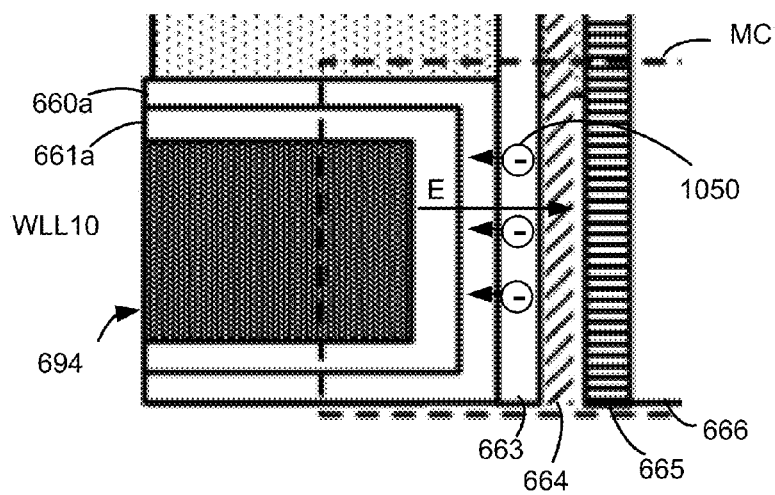
FIG. 12 depicts a portion of the memory cell MC of FIG. 6 showing electron injection into a charge trapping region during weak programming.

FIG. 12 depicts a portion of the memory cell MC of FIG. 6 showing electron injection into a charge trapping region during weak programming. The memory cell includes a control gate 694, a metal barrier 661a, a blocking oxide 660a, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps. A weak erasing similarly involves an electric field which repels electrons from the charge trapping layer, decreasing the Vth.

Figure 13:
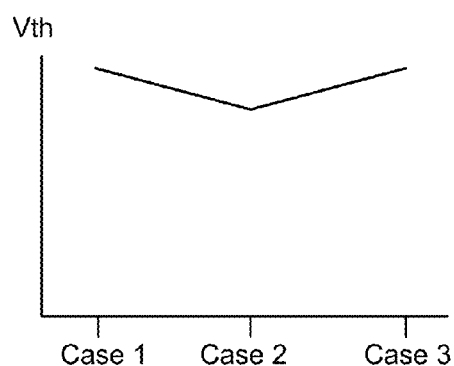
FIG. 13 depicts a plot showing a change in Vth of an example memory cell for three different cases.

FIG. 13 depicts a plot showing a change in Vth of an example memory cell for three different cases. Case 1 represents a second read situation which occurs shortly after programming for the A state, as an example. In this case, Vth is at a coupled up level. Case 2 represents a first read situation which occurs shortly after the memory device is powered down and then power up, or after a relatively long period since a last sensing operation. In this case, Vth is not at a coupled up level. Recall that when the device is powered on, the word lines may be set to 0 V in a diagnostic process which checks for bad blocks. The non-coupled up Vth may be about 0.1 V (3 sigma value) lower than the coupled up Vth. Case 3 represents a read operation which occurs after a dummy voltage or read voltage is applied to word lines in a block. In this case, Vth is at a coupled up level. This case shows the effectiveness of a dummy voltage, e.g., a dummy read operation, in avoiding the first read situation.

As mentioned, when a read operation occurs right after another sensing operation, a Vth upshift is observed. After waiting for one hour, for instance, and performing another read operation, a Vth downshift is observed, for the lower programmed data states. If another read operation occurs right away, a Vth upshift is observed. Since the read levels are decided based on a Vth distribution in a second read situation, which is the most common situation, an elevated number of read errors may be observed in the first read situation.

FIG. 14A depicts a plot of an example dummy voltage of a word line and a subsequent coupled up voltage of the word line. As mentioned, a dummy voltage can be used to avoid the first read situation in which the usual coupling up of the word line voltage is not present. The dummy voltage triggers the coupling up of the word line voltage so that a second read situation is present when a read command is issued. One option is to apply the dummy read voltage in response to the issuance of a read command from the controller.

The magnitude of the dummy voltage, Vdummy, should be at least as high as a highest verify voltage of the different verify voltages used to program memory cells to different data states, in one implementation. The memory cells are not sensed during the dummy voltage pulse, the memory cells are programmed to different data states using different verify voltages and a magnitude of the dummy voltage is at least as high as a highest verify voltage of the different verify voltages. For example, for a memory device with four, eight or sixteen states, Vdummy should be at least VvC, VvG or VvS15, respectively. This ensures that the maximum coupling down of Vch and the maximum coupling up of Vwl will occur.

One approach to applying a dummy voltage is to apply the voltage to all data word lines in a block concurrently. Another approach is to apply the voltage to fewer than all data word lines in a block concurrently. When the dummy voltage is applied, in one approach, the bit line voltage Vbl=0 V, and the voltages of the select gate control lines and the dummy word lines is sufficiently high to provide the select gate transistors and the dummy memory cells, respectively, in a conductive state, e.g., so the channel is not cutoff. By applying the dummy voltage at a sufficiently high level and then decreasing it back to 0 V, for instance, the second read situation is provided before initiating a read operation.

The horizontal axis depicts time and the vertical axis depicts word line voltage, Vwl. A dummy voltage plot 1400 (e.g., a voltage pulse or waveform) is applied to the word lines in a block from t0-t5 and reaches a magnitude of Vdummy. The voltage includes an increasing portion 1400a, a portion 1400b at Vdummy and a decreasing portion 1400c. Due to an RC time constant of the word lines and the capabilities of the word line driver, the requested voltage is not immediately realized when a voltage driver is commanded to provide the requested voltage. For example, Vdummy may be requested at t0, and 0 V may be requested at t3. The voltage drivers may be commanded to no longer provide a voltage at t5 (e.g., to disconnect the voltage drivers from the word lines) to allow the voltages to float.

For example, a control circuit may be configured to command a voltage driver to increase voltages of the word lines from an initial level (e.g., 0 V) to an elevated level (e.g., Vdummy), and then to decrease the voltages of the word lines from the elevated level to a final level (e.g., 0 V). The control circuit, to float the voltages of the word lines, is configured to disconnect the voltage driver from the word lines a specified time (e.g., after a time duration of t5–t3) after requesting that the voltage driver decrease the voltages of the word lines from the elevated level to the final level.

At t4, the voltage falls below VvG so that the memory cells in the G state are made non-conductive state. The remaining transition of the voltage provides capacitive coupling, as discussed. Memory cells in lower states are made non-conductive when the voltage falls lower. Different contributions to the coupling up of a word line can therefore be made by the different cells connected to the word line according to their respective data states. An overall coupled up voltage on the word line will be provided.

As the dummy voltage decreases from VvG to 0 V, the channel is capacitively coupled down by a similar amount, as represented by a dashed line 1410a in FIG. 14B.

FIG. 14B depicts a plot of a channel voltage which is coupled down from a starting level, e.g., 0 V, and subsequently returns to the starting level, consistent with FIG. 14A. The channel is capacitively coupled down to a minimum level of Vch_min and then begins to return to its starting level from t5-t6. The voltages of the word lines are allowed to float starting at t5, so that the voltages (plot 1402) are capacitively coupled higher by the increase in Vch (plot 1410b). The voltages of the word lines float to a peak level of Vwl_coupled_up.

FIG. 15A depicts the dummy voltage plot 1400 of FIG. 14A followed by the read voltage 1030 of FIG. 10C, followed by a decay of the coupled up voltage of the word line over a longer time period. The plot 1400 depicts the dummy voltage (in a time period t0-t1). For a high temperature case, a plot 1510 depicts an increase in Vwl to a coupled up level (Vwl_coupled_up) due to coupling (in a time period t1-t2) followed by a decay of Vwl (in a time period t2-t6—plot 1510a). For a low temperature case, a plot 1513 depicts an increase in Vwl due to coupling (in a time period t1-t3) followed by a decay of Vwl (in a time period t3-t6—plot 1513a). The time for the word line coupling up increases as temperature decreases.

Generally, the increase in Vwl occurs relatively quickly compared to the time period of the decay. For the low temperature case, the read voltage waveform 1030 is applied from t4-t5 after the word line has been coupled up to the peak level of Vwl_coupled_up. If the read voltage waveform 1030 was applied too soon, the word line would not be coupled up to the peak level, and the Vth would not be at the level which is expected in the second read situation. This could result in read errors. For example, see FIG. 17C2. For the high temperature case, the read voltage waveform 1030 can be applied sooner, e.g., starting after t2 but sooner than t3.

FIG. 15B depicts a plot of a channel voltage which is coupled down from a starting level and subsequently returns to the starting level, consistent with FIG. 15A. For the high temperature case, a decrease to Vch_min followed by an increase (plot 1504) occurs in the time period t1-t2. For the low temperature case, a decrease to Vch_min followed by an increase (plot 1505) occurs in the longer time period t1-t3. Vch is about 0 V from t3-t6 (plot 1506).

FIG. 15C depicts a plot of a Vth of a memory cell connected to the coupled up word line, consistent with FIGS. 15A and 15B. For a cell in an example data state, such as the A state, the Vth is at an initial level, Vth_initial, from t0-t1. Vth increases due to coupling at the same time as the increase in Vch, to a peak level of Vth_coupled_up. The Vth then gradually decreases back to Vth_initial. For the high temperature case, Vth increases from t1-t2 as depicted by plot 1507 and a gradual decrease in Vth occurs from t1-t6. For the low temperature case, Vth increases from t1-t3 as depicted by plot 1508 and a gradual decrease in Vth occurs from t3-t6 (plot 1509).

Figure 16A:
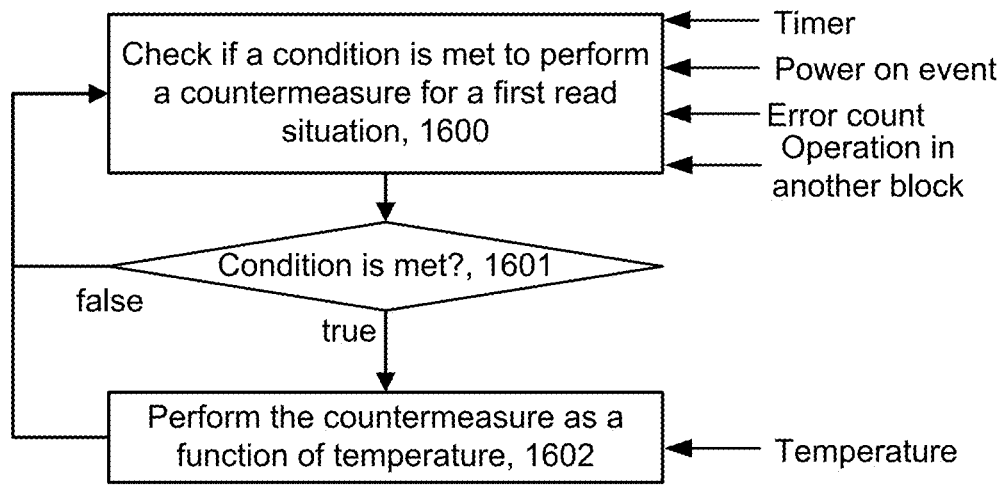
FIG. 16A depicts an example process for deciding when to perform a countermeasure for a first read situation.

FIG. 16A depicts an example process for deciding when to perform a countermeasure for a first read situation. Step 1600 involves checking if a condition is met to perform a countermeasure for a first read situation. Such a countermeasure can occur when a first read situation is present, such as by adjusting read voltages. Or, such a countermeasure can occur when a first read situation is not present, such as by setting word line voltages of an unselected block to prevent a discharge of the voltages which could result in a transition from the second read situation to the first read situation. The condition may be met based on various factors including a timer, e.g., which indicates an elapsed time since a last sensing operation for a block, a power on event, an error count and information regarding an operation in another block. Decision step 1601 determines whether the condition is met.

The condition may be met if the first read situation exists for a block. A block may be in the first read situation, e.g., if no sensing operation has occurred in the block since a last power on event, if a time period since a last sensing operation in the block exceeds a threshold and/or if a coupled up potential of the word lines is discharged by voltages provided by the voltage drivers for the word lines. The second read situation may exist if, e.g., a sensing operation has occurred in the block since a last power on event, if a time period since a last sensing operation in the block does not exceed a threshold and/or if a coupled up potential of the word lines is not discharged by voltages provided by the voltage drivers for the word lines.

If the condition is met, step 1602 includes performing the countermeasure as a function of temperature. If the condition is not met, step 1600 continues checking. Various implementations of the process are possible.

In one approach, an apparatus consistent with the process comprises a block comprising memory cells, the memory cells are arranged in strings and connected to a set of word lines, and a control circuit, where the control circuit is configured to perform a countermeasure for a first read situation in the block, wherein the countermeasure is a function of a temperature In one approach, the memory cells are programmed to different programmed data states including a lowest programmed data state and a highest programmed data state; and to perform the countermeasure, a control circuit is configured to set a read voltage of the lowest programmed data state according to a positive temperature coefficient, and to set a read voltage of the highest programmed data state according to a negative temperature coefficient.

In another approach, the memory cells are programmed to different programmed data states, and to perform the countermeasure, the control circuit is configured to set read voltages of lower programmed data states according to different positive temperature coefficients, wherein a largest magnitude positive temperature coefficient is used for a lowest programmed data state, and to set read voltages of higher programmed data states according to different negative temperature coefficients, wherein a largest magnitude negative temperature coefficient is used for a highest programmed data state. See also FIG. 17K.

Figure 16B:
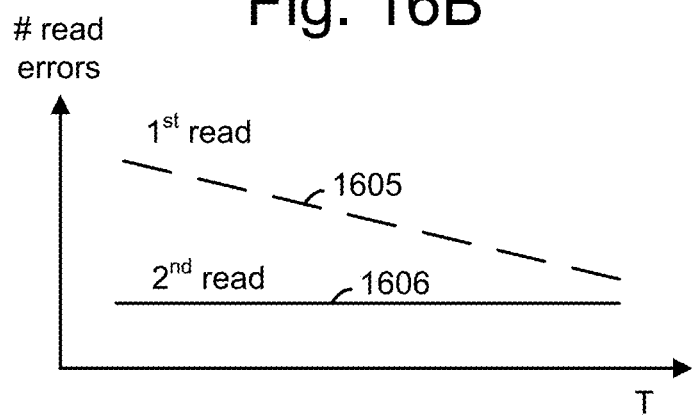
FIG. 16B depicts a plot of a number of read errors versus temperature, for a first read situation (plot 1605) and a second read situation (plot 1606).

FIG. 16B depicts a plot of a number of read errors versus temperature, for a first read situation (plot 1605) and a second read situation (plot 1606). This shows how the number of read errors increases as temperature decreases, for the first read situation. However, the number of read errors is essentially independent of temperature, for the second read situation. These plots assume the same read voltages are used for the first and second read situations. By optimizing the read voltages for the first read situation based on temperature, the number of errors can be significantly reduced to a level similar to what is represented by plot 1606. Due to the worsening of the first read problem at lower temperatures, a control circuit can be configured to set the countermeasure to be relatively more severe when the temperature is relatively lower. For example, a shift in a read voltage can be relatively larger when the temperature is relatively lower. Or, a word line driver voltage in an inactive block can be relatively larger when the temperature is relatively lower.

FIG. 17A depicts an example implementation of the process of FIG. 16A, where initial read voltages and, optionally, additional read voltages for error recovery, are set based on temperature when a first read situation exists. At step 1700, a command is received to perform a read operation for a selected word line. In one approach, a read command is made by a host device and transmitted to the external controller 122 of FIG. 1A. The external controller in turn instructs the control circuitry 110 to perform the read operation. A decision step 1701 determines if a first read situation exists for the block in which the word line is located. If the first read situation does not exist, e.g., the second read situation exists, a default set of read voltages (e.g., VrA, VrB, VrC, VrD, VrE, VrF and VrG) may be set at step 1702.

The read operation is then performed at step 1705 using the set of read voltages. Step 1706 determines a number of read errors. If the number of errors does not exceed an error threshold at decision step 1707, the read operation is successfully completed at step 1710. The error threshold could represent the number of correctable errors using ECC decoding, for example. If the number of errors exceeds the error threshold at decision step 1707, a decision step 1708 determines whether a number of re-reads exceeds a threshold. If the number of re-reads (the additional reads in the error recovery process which occur after the initial read) does not exceed a threshold, the read voltages are adjusted at step 1709 to provide an adjusted set of read voltages and, at step 1705, an additional read operation is performed using the adjusted set of read voltages. Step 1709a indicates that for a first read situation, the read voltages are shifted based on temperature. The shift is to a lower voltage for lower programmed states and to a higher voltage for higher programmed states. This approach is efficient since the read voltage shift is in one direction (rather than both higher and lower) based on the expected failure mode of the cells. That is, read errors for cells in lower programmed states are expected to be caused by a downward Vth shift and read errors for cells in upper programmed states are expected to be caused by an upward Vth shift.

Step 1709b indicates that for a second read situation, the read voltages are shifted higher and/or lower. The shifts may be independent of temperature, in one approach.

If the number of re-reads exceeds a threshold, step 1711 performs a read with a continuous voltage sweep. This type of read increments the read voltage in several small increments for each data state with a goal of locating valleys in the Vth distributions which represent a division between adjacent data states. This may be a final error recovery effort.

A timer is set at step 1712 so that the elapsed time until the next read operation is known.

At decision step 1701, if the first read situation exists, step 1703 obtains a temperature of the memory device and step 1704 selects an initial set of read voltages based on temperature. For example, this can include VrA_lt, VrB_lt, VrC_lt, VrD_lt, VrE_lt, VrF_lt and VrG_lt at lower temperatures, and VrA_ht, VrB_ht, VrC_ht, VrD_ht, VrE_ht, VrF_ht and VrG_ht at higher temperatures. If the first read situation exists, when the read voltages are adjusted a first time at step 1709, the first adjusted read voltages can be VrA_lt1, VrB_lt1, VrC_lt1, VrD_lt1, VrE_lt1, VrF_lt1 and VrG_lt1 at lower temperatures, and VrA_ht1, VrB_ht1, VrC_ht1, VrD_ht1, VrE_ht1, VrF_ht1 and VrG_ht1 at higher temperatures. If the first read situation exists, when the read voltages are adjusted a second time at step 1709, the second adjusted read voltages can be VrA_lt2, VrB_lt2, VrC_lt2, VrD_lt2, VrE_lt2, VrF_lt2 and VrG_lt2 at lower temperatures, and VrA_ht2, VrB_ht2, VrC_ht2, VrD_ht2, VrE_ht2, VrF_ht2 and VrG_ht2 at higher temperatures.

In one approach, the process includes determining if a number of errors in the reading of the memory cells exceeds an error threshold, and if the a number of errors in the reading of the memory cells exceeds the error threshold, reading the memory cells using an adjusted read voltage for the lowest programmed data state which is set according to the positive temperature coefficient and which is less than the initial read voltage for the lowest programmed data state, and using an adjusted read voltage of the highest programmed data state which is set according to the negative temperature coefficient and which is greater than the initial read voltage for the highest programmed data state.

The error recovery process of FIG. 17A adjust the read voltages dynamically. Generally, a read operation using the default set of read voltages is the fastest. However, if this fails, a recovery operation can occur with one or more re-reads. In each pass, an additional read occurs in which the read voltages are shifted from the default read voltages. If that also fails, the cells are read using a continuous voltage sweep. However, this is very time consuming so it should be avoided if possible. The read voltages should thus be set to optimal levels which will satisfy an ECC criterion of no uncorrectable errors. Further, due to the impact of temperature on the first read situation, we can select different sets of read voltages at different temperatures. For high temperatures, we select smaller downshifts in the read voltages of the lower states and smaller upshifts in the read voltages of the higher states. For low temperatures, we select larger downshifts in the read voltages of the lower states and larger upshifts in the read voltages of the higher states.

FIG. 17B depicts another example implementation of the process of FIG. 16A, where a dummy voltage is applied before read voltages when a first read situation exists, and a wait period between the dummy voltage and the read voltages is a function of temperature. The process is consistent with FIG. 15A. At step 1720, a command is received to perform a read operation for a selected word line. A decision step 1721 determines if a first read situation exists for the block in which the word line is located, as discussed previously. If the first read situation does not exist, e.g., the second read situation exists, a default set of read voltages (e.g., VrA, VrB, VrC, VrD, VrE, VrF and VrG) may be selected and the read operation performed at step 1722. In this case, a dummy voltage is not applied since the word lines are already in a coupled up state. The process then ends.

At decision step 1721, if the first read situation exists, step 1723 applies a dummy voltage to the block to couple up the voltages of the word lines. Step 1724 obtains a temperature of the memory device and step 1725 sets a wait period which is a function of a negative Tco (wait period is shorter when temperature is higher). See FIG. 17C1. Step 1726 selects a set of read voltages based on the temperature. For example, this can include VrA_lt, VrB_lt, VrC_lt, VrD_lt, VrE_lt, VrF_lt and VrG_lt at lower temperatures, and VrA_ht, VrB_ht, VrC_ht, VrD_ht, VrE_ht, VrF_ht and VrG_ht at higher temperatures. At step 1727, after the wait period has elapsed, a read operation is performed using the set of read voltages which are based on temperature.

Note that the read voltage shifts and/or error recover processes of FIG. 17A can be combined with the dummy voltages of FIG. 17B. For example, a dummy voltage can be applied while also shifting the read voltages at low temperatures. In one option, the read voltages of a read operation are shifted by a smaller amount when a dummy voltage is applied before the read operation than when a dummy voltage is not applied before the read operation.

Generally, when cells are in the first read situation, they can be transitioned to the second read situation by applying a dummy voltage. However, in order to completely transition to the second read situation, the wait period time between dummy voltage and the read voltage may be in the tens of milliseconds range, which hurts read performance if it is done before all read operations. One alternative is to adjust the wait period based on temperature. If reading at high temperature, the wait period can be short, e.g., 10-100 microseconds. If reading at low temperature, the longer wait period can be used. In another approach, when the read time is critical, the dummy voltage can be used only at high temperatures and not at low temperatures. Instead, at low temperatures, the dummy voltage is not used and we can proceed directly with the read operation with adjusted read voltages or even with the continuous voltage sweep.

FIG. 17C1 depicts a plot of a wait period versus temperature (T), consistent with step 1725 of FIG. 17B. The wait period is a function of a negative Tco such that the wait period is shorter when temperature is higher. In one approach, (plot 1735), the wait period may reach zero at a specified temperature, T1. In another approach, (plot 1736), the wait period reaches a minimum non-zero level at higher temperatures. Other approaches are possible as well. Moreover, the relationship between the wait period and temperature may be linear or non-linear.

FIG. 17C2 depicts a plot of a number of read errors versus a wait period between a dummy voltage and a read voltage waveform, for a lower page (plot 1610), a middle page (plot 161) and an upper page (plot 1612). As mentioned, by providing a sufficient wait period between the end of the dummy voltage and the start of the read voltage, the word line can be coupled up to the peak level. Further, the number of errors, which a function of the page being read, can be reduced. See also FIG. 8D.

FIG. 17D depicts an example implementation of step 1723 of FIG. 17B. At step 1730, at a first time (e.g., t0 in FIG. 14A), a voltage driver is commanded to increase voltages of the word lines in a block from an initial level (e.g., 0 V) to an elevated level (Vdummy). The voltages are then maintained at the elevated level for a specified time, e.g., until t3 in FIG. 14A. As mentioned, the magnitude of Vdummy may be at least as high as a highest verify voltage of the one or more programmed states. The highest verify level can differ according to a mode in which the memory device operates. For example, assume a memory device can operate in a two state, four state, eight state or sixteen state mode, where the highest verify level is VvSLC, VvC, VvG and VvS15, respectively. These levels can differ from one another. Power can be saved by setting Vdummy at a level which is based on the highest verify level of the current mode. In one implementation, the control circuit is configured to program the memory cells in a selected mode of a plurality of modes, where each mode has a different number of data states, and to set magnitudes of the dummy voltage pulses based on the selected mode.

At step 1731, at a subsequent second time, e.g., t3 in FIG. 14A, the voltage driver is commanded to decrease voltages from the elevated level to a final level, e.g., 0 V. This request can be for a step change or a gradual ramp decrease, for instance. Step 1732, at a third time which is a specified time after the second time, includes causing the word line voltages to float by disconnecting the voltage driver from the word lines.

FIG. 17E depicts another example implementation of the process of FIG. 16A, where voltage drivers for an unselected block in a group of blocks provide voltages which are a function of temperature. Referring also to FIGS. 18A and 18B, some memory devices have an arrangement in which a separate set of voltage drivers is provided for each block, but the pass gates which connect the voltage drivers to the word lines in each block are commonly controlled for a group of blocks. This may be done based on layout requirements of the memory device. As a result, when an operation (e.g., read, program or erase) is being performed for one block in the group, the pass transistors of all the blocks in the group will be in a conductive state and the voltage drivers will be connected to the word lines for all of these blocks. The word lines will thus be driven by the voltage output of the voltage drivers. When no operation is being performed for any block in the group, the pass transistors of all of the blocks in the group will be in a non-conductive state and the voltage drivers will be disconnected from the word lines for all of these blocks. The word line voltages will thus be floating.

Generally, for the unselected blocks in which no operation is being performed, the voltages can be set relatively high to prevent or reduce a discharge of word lines which may be in a coupled up state. However, power consumption is proportional to the voltages. To minimize power consumption, the word line voltages can be set as a function of temperature. In one approach, the word line voltages are set to a relatively high level when the temperature is relatively low, since the first read Vth shifts are larger when the temperature is lower. In one approach, this can be done without knowing whether the unselected block is in the first or second read situation. In another approach, the word line voltages are set to a relatively high level when the temperature is relatively low, in response to knowing that the unselected block is in the second read situation. If the unselected block is in the first read situation, the word lines are already discharged so elevating the word line voltages does not prevent a discharge. This approach can save additional power by further limiting when the word line voltages are elevated.

The elevated word line voltage can be set to various levels. In one approach, the on-chip voltage Vdd, e.g., 2-3 V, may be used at low temperatures. Or, a higher voltage such as 4 V can be used. The word line voltage can be a relatively low level of, e.g., 1 V at high temperatures or as a default. This can be the level provided to a source line, for example, as Vsl.

In an example process, at step 1740, a command is received to perform an operation for a selected block. Step 1741 determines if a first or second read situation exists for each unselected block. Step 1742 sets a common pass transistor voltage high (sufficiently high to provide the pass transistors in a conductive state) for each block of the group to connect the voltage drivers to the word lines and select gate lines in each block. Step 1743 sets the voltage drivers for the selected block to perform the operation. For example, for a read operation, a read voltage is applied to a selected word line and pass voltages are applied to unselected word lines. Step 1744 sets the voltage drivers for the unselected blocks as a function of temperature, for the unselected blocks in the second read situation. Step 1745 sets the voltage drivers for the unselected blocks to a default level, for the unselected blocks in the first read situation.

FIG. 17F depicts a plot of Vblk_unsel_tco (a voltage applied to word lines in an unselected block) versus temperature (T), consistent with step 1744 of FIG. 17E. The voltage is applied using a negative temperature coefficient (the voltage is lower when the temperature is higher. In the example of plot 1750, there is a linear relationship between Vblk_unsel_tco and T. In the example of plot 1751, Vblk_unsel_tco is fixed at a high level when T<Ta and at a low level when T>Tc. Vblk_unsel_tco decreases linearly with T for Ta<=T<=Tc. In the example of plot 1752, Vblk_unsel_tco has two levels: a high level when T<Tb and at a low level when T>=Tb.

Thus, in one approach, the word lines are connected to voltage drivers, and to perform a countermeasure, a control circuit is configured to set a voltage on the word lines according to a negative temperature coefficient. Note that a temperature coefficient can be defined by two or more temperatures and associated voltages, whether they are Vblk_unsel_tco or read voltages, for instance.

FIG. 17G depicts control gate and channel voltages on a memory cell which acts as a capacitor in an unselected block, consistent with steps 1744 and 1745 of FIG. 17E. The memory cell 1760 depicts a control gate (word line) voltage of Vdd=2-3 V and a channel voltage of 0 V. This gate-to-channel voltage may be high enough to reduce the discharge of electrons from the charge trapping layer. The memory cell 1761 depicts a control gate (word line) voltage of Vsl=1 V and a channel voltage of 0 V. This gate-to-channel voltage may not be high enough to reduce the discharge of electrons from the charge trapping layer.

Figure 17H:
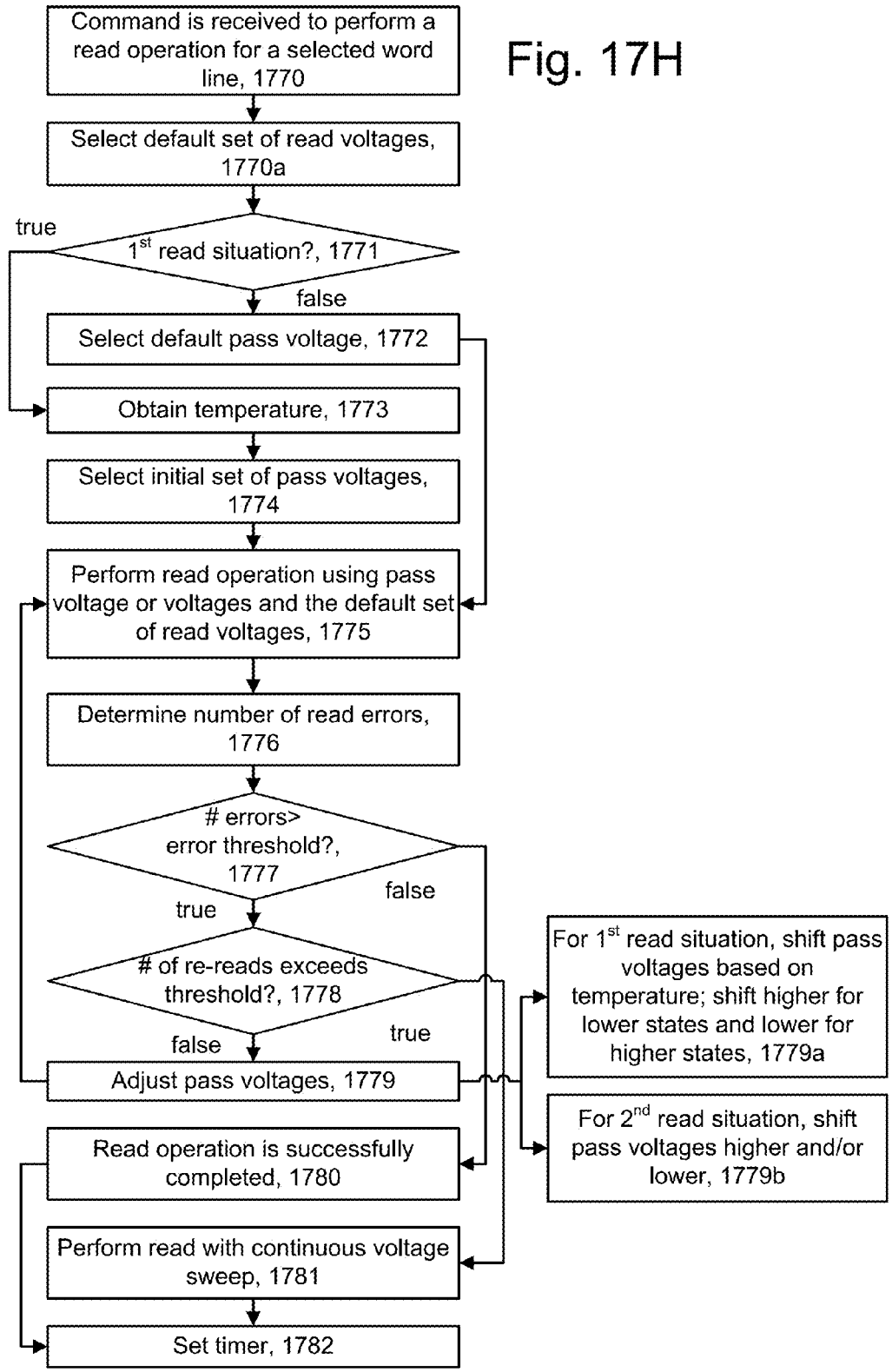
FIG. 17H depicts another example implementation of the process of FIG. 16A, where an initial pass voltage and, optionally, additional pass voltages for error recovery, are set based on temperature when a first read situation exists.
Figure 18A:
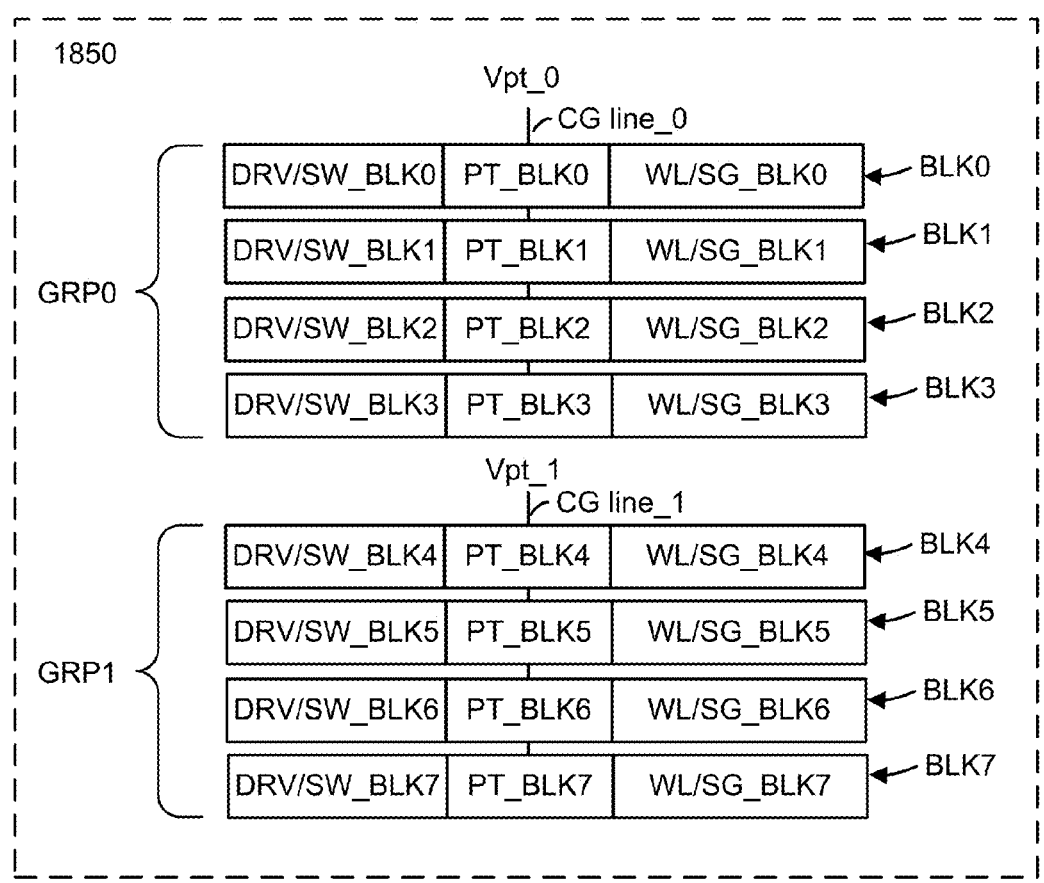
FIG. 18A depicts an example circuit comprising a first group of blocks GRP0 having a common control gate line (CG line_0) for pass transistors of the group, and a second group of blocks GRP1 having a common control gate line (CG line_1) for pass transistors of the group.
Figure 18B:
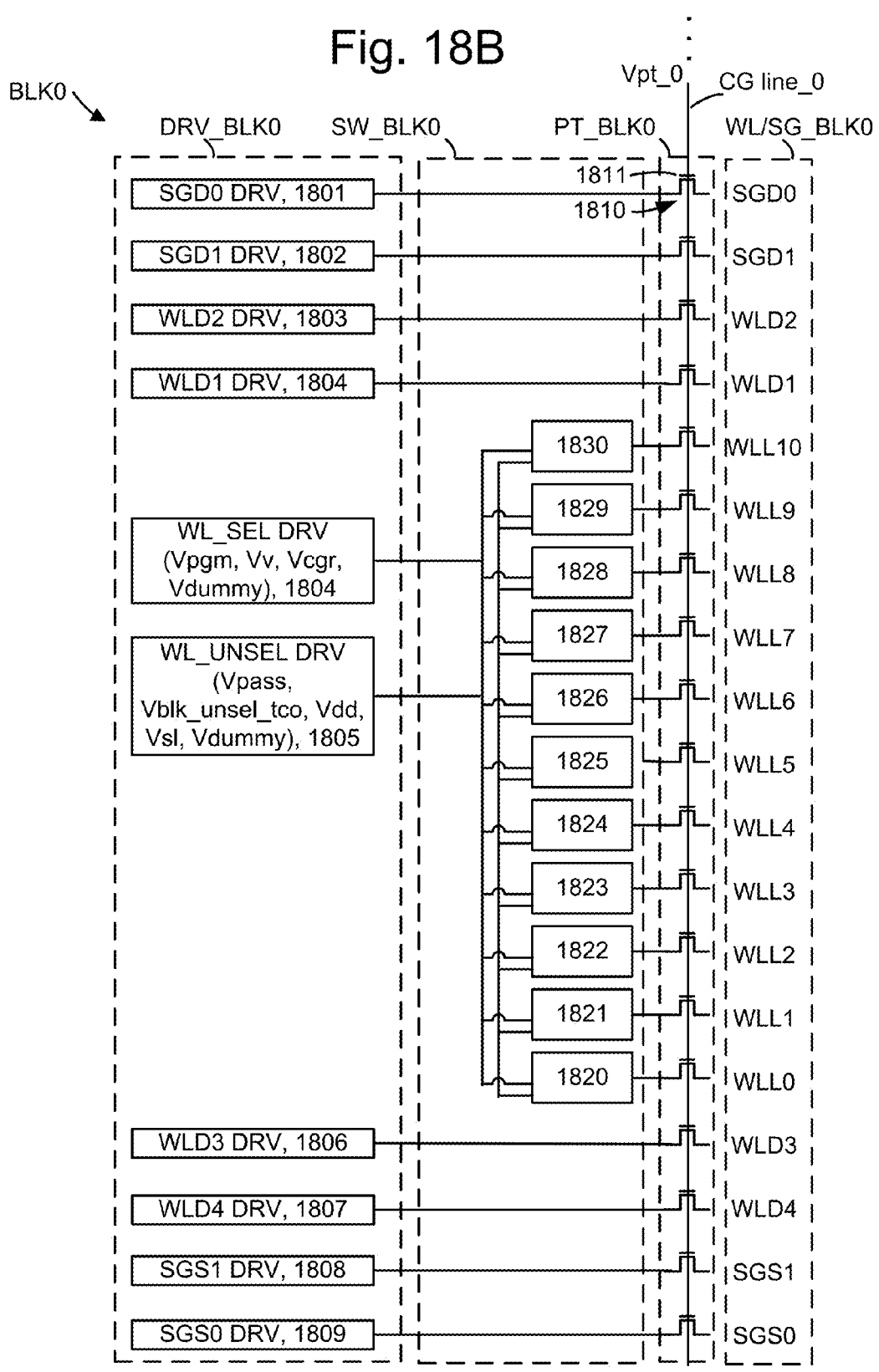
FIG. 18B depicts an example circuit which includes the voltage drivers DRV_BLK0, switches SW_BLK0, pass transistors PT_BLK0 and word lines and select gate lines WL/SG_BLK0 of BLK0 of FIG. 18A.

FIG. 17H depicts another example implementation of the process of FIG. 16A, where an initial pass voltage and, optionally, additional pass voltages for error recovery, are set based on temperature when a first read situation exists. The process is analogous to that of FIG. 17A except Vpass is adjusted as a countermeasure for the first read situation. As mentioned at the outset, pass voltages of unselected word lines can be adjusted based on temperature during a read operation for cell in the first read situation. This can be done alternatively or additionally to the adjustment of read voltages. Moreover, the direction of the adjustment to the pass voltages is opposite to the direction of adjustment of the read voltages.

This can be understood by considering the current through a string of cells such as a NAND string during sensing. The current will be higher when the cells are in a more highly conductive state. This occurs when their control gate voltage are higher. Similarly, the current will be lower when the cells are in a less conductive state, when their control gate voltage are lower. Thus, the effect of applying a lower control gate voltage on a selected cell during a read operation is the same as applying a higher control gate voltage to the remaining unselected cells in the string, for instance. Similarly, the effect of applying a higher control gate voltage on a selected cell during a read operation is the same as applying a lower control gate voltage to the remaining unselected cells in the string, for instance. The shift in Vpass can be different than the shift in the read voltage, however. Generally, a shift in the read voltage will have a larger effect on the current in the string than an equivalent shift in pass voltage. Accordingly, the equivalent of a shift of X Volts in the read voltage is a larger shift or Y>X Volts in the pass voltages.

At step 1770, a command is received to perform a read operation for a selected word line. Step 1770a selects a default set of read voltages. A decision step 1771 determines if a first read situation exists for the block in which the word line is located. If the first read situation does not exist, a default pass voltage (Vpass_def) is selected at step 1772.

The read operation is then performed at step 1775 using the selected pass voltage and the default set of read voltages. Step 1776 determines a number of read errors. If the number of errors does not exceed an error threshold at decision step 1777, the read operation is successfully completed at step 1780. If the number of errors exceeds the error threshold at decision step 1777, a decision step 1778 determines whether a number of re-reads exceeds a threshold. If the number of re-reads does not exceed a threshold, the pass voltage or voltages are adjusted at step 1779 to provide adjusted pass voltages and, at step 1775, an additional read operation is performed using the adjusted pass voltages. Step 1779a indicates that for a first read situation, the pass voltages are shifted based on temperature. The shift is to a higher pass voltage during reading of lower programmed states and to a lower pass voltage during reading of higher programmed states.

Step 1779b indicates that for a second read situation, the pass voltages are shifted higher and/or lower. The shifts may be independent of temperature, in one approach.

If the number of re-reads exceeds a threshold, step 1781 performs a read with a continuous voltage sweep. A timer is set at step 1782 so that the elapsed time until the next read operation is known.

At decision step 1771, if the first read situation exists, step 1773 obtains a temperature of the memory device and step 1774 selects an initial set of pass voltages based on temperature. For example, these can be Vpass_A, Vpass_B, Vpass_C, Vpass_D, Vpass_E, Vpass_F and Vpass_G. See FIG. 17I. In this case, the pass voltages can be adjusted for each re-read of the error recovery process. The shift in the pass voltage from the initial level for each data state can become larger for each re-read. Moreover, the shifts can be a function of data state. The shifts can be progressively larger for progressively lower and higher programmed data states. The shifts can be smaller for midrange programmed data states.

Figure 17I:
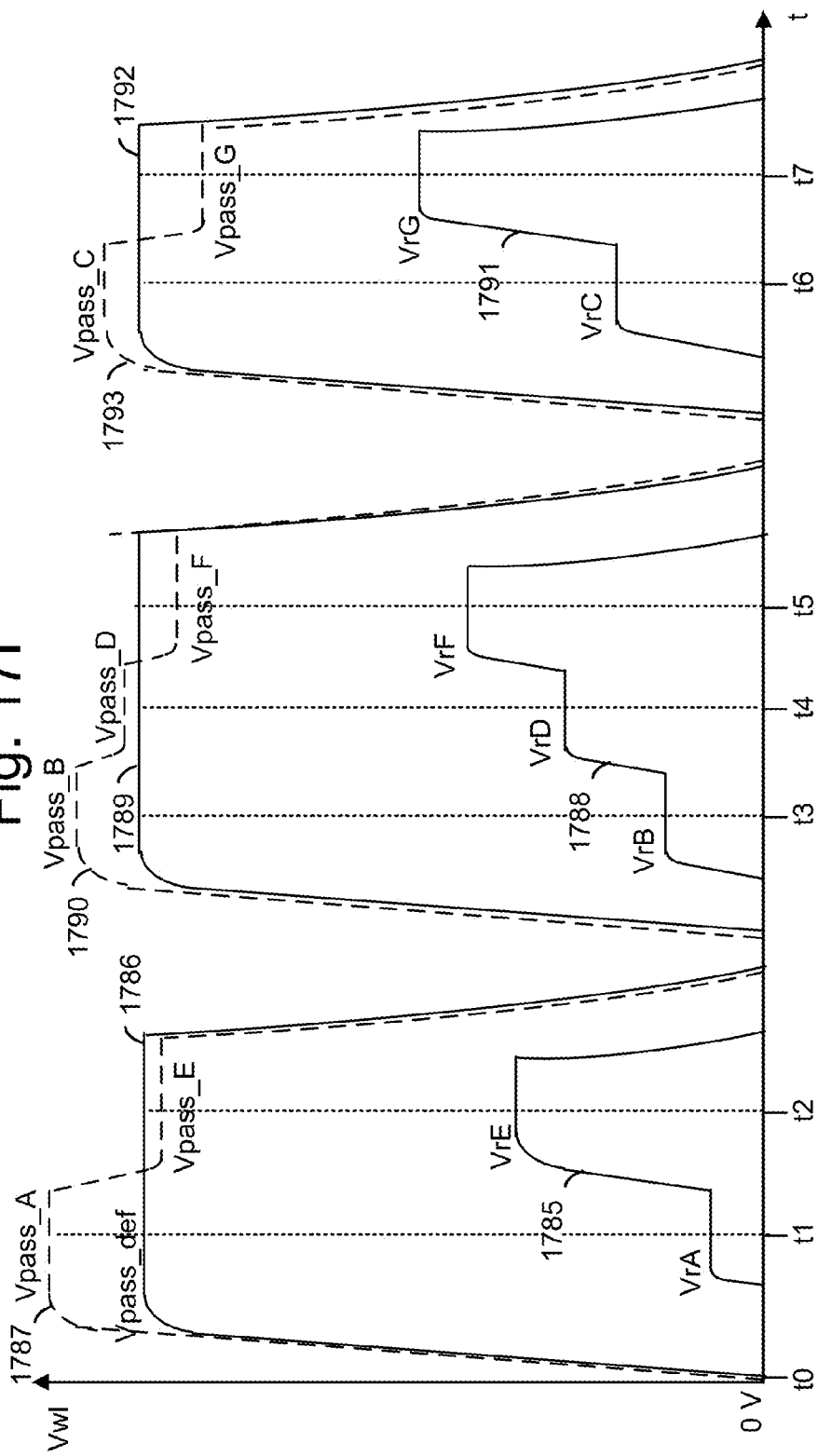
FIG. 17I depicts read voltages and pass voltages in an example read operation, where the pass voltage is set as a function of temperature when the memory cells are in the first read situation, and where lower, middle and upper pages are read separately.

FIG. 17I depicts read voltages and pass voltages in an example read operation, where the pass voltage is set as a function of temperature when the memory cells are in the first read situation, and where lower, middle and upper pages are read separately. Vpass can be adjusted based on temperature when the memory cells are in a first read situation. Vpass is at a default level of Vpass_def for the case of high temperature in the first read situation, or for the second read situation.

In a first portion of the read operation, the A and E states are read using a read voltage waveform 1785. Pass voltage waveforms 1786 or 1787 are used for high and low temperatures, respectively. Sensing of the A and E states occurs at t1 and t2, respectively, while Vpass is at Vpass_A or Vpass_E, respectively, for the case of a low temperature.

In a second portion second portion of the read operation, the B, D and F states are read using a read voltage waveform 1788. Pass voltage waveforms 1789 or 1790 are used for high and low temperatures, respectively. Sensing of the B, D and F states occurs at t3, t4 and t5, respectively, while Vpass is at Vpass_B, Vpass_D or Vpass_F, respectively, for the case of a low temperature.

In a third portion of the read operation, the C and G states are read using a read voltage waveform 1791. Pass voltage waveforms 1792 or 1793 are used for high and low temperatures, respectively. Sensing of the C and G states occurs at t6 and t7, respectively, while Vpass is at Vpass_C or Vpass_G, respectively, for the case of a low temperature.

In this example, Vpass is progressively higher for progressively lower programmed data states, e.g., Vpass_def<Vpass_D<Vpass_C<Vpass_B<Vpass_A. Vpass is progressively lower for progressively higher programmed data states, e.g., Vpass_def>Vpass_E>Vpass_F>Vpass_G.

FIG. 17J depicts a shift in pass voltage versus temperature, consistent with FIG. 17I. Each line is associated with a data state as indicated and the slope of each line is the Tco. Tco is negative for the lower programmed data states of A, B, C and D. Further, the shift from the default pass voltage is positive for these data states. Tco is positive for the higher programmed data states of E, F and G. Further, the shift from the default pass voltage is negative for these data states.

In the example, there is a linear relationship between the shift and T. Other waveforms could be used as well, such as in FIG. 17F. For example, the shift could have only two levels for each data state: one at a high temperature and one at a low temperature.

In an example implementation, the memory cells are programmed to different programmed data states including a lowest programmed data state (e.g., A) and a highest programmed data state (e.g., G); and to perform the countermeasure, the control circuit is configured to set a pass voltage of unselected word lines according to a negative temperature coefficient when a read voltage (VrA) of the lowest programmed data state is applied to a selected word line, and to set the pass voltage of the unselected word lines according to a positive temperature coefficient when a read voltage (VrG) of the highest programmed data state is applied to a selected word line.

In another example implementation, to perform the countermeasure, the control circuit is configured to set a pass voltage of unselected word lines according to different negative temperature coefficients when read voltages are applied to a selected word line for lower programmed data states, wherein a largest magnitude negative temperature coefficient (the Tco for the A state in FIG. 17J) is used during a read voltage for the lowest programmed data state, and to set the pass voltage of the unselected word lines according to different positive temperature coefficients when read voltages are applied to the selected word line for higher programmed data states, wherein a largest magnitude positive temperature coefficient (the Tco for the G state in FIG. 17J) is used during a read voltage for the highest programmed data state.

FIG. 17K depicts a shift in read voltage versus temperature, consistent with FIG. 8I. Each line is associated with a data state as indicated and the slope of each line is the Tco. Tco is negative for the higher programmed data states of E, F and G. Further, the shift from the default read voltage is positive for these data states. Tco is positive for the lower programmed data states of A, B, C and D. Further, the shift from the default read voltage is negative for these data states. In the example, there is a linear relationship between the shift and T. Other waveforms could be used as well, such as in FIG. 17F. For example, the shift could have only two levels for each data state: one at a high temperature and one at a low temperature.

FIG. 17L depicts a Tco for Vpass for the different data states of FIG. 17J. Each letter A-G represents a data state and a corresponding value of Tco. Tco for Vpass is negative for the lower states A-D and positive for the higher states of E-G. Tco for Vpass is progressively more negative during reading of lower data states and progressively more positive during reading of higher data states. This approach allows the Tco to be optimized for each data state. Another approach is to group adjacent states and use one Tco for a group. For example, groups can include states A and B, C and D, and F and G. State E can remain alone. This can simply the implementation.

FIG. 17M depicts a Tco for read voltage for the different data states of FIG. 17K. Each letter A-G represents a data state and a corresponding value of Tco. Tco is positive for the lower states A-D and negative for the higher states of E-G. Tco for Vpass is progressively more positive for reading of lower data states and progressively more negative for reading of higher data states. Another approach is to group adjacent states and use one Tco for a group, as discussed.

FIG. 18A depicts an example circuit 1850 comprising a first group of blocks GRP0 having a common control gate line (CG line_0) for pass transistors of the group, and a second group of blocks GRP1 having a common control gate line (CG line_1) for pass transistors of the group. Each group includes voltage drivers (DRV), switches (SW), pass transistors (PT) and word lines (WL) and select gate lines (SG) or a block. For example, in GRP0, a first block BLK0 includes DRV/SW_BLK0, PT_BLK0 and WL/SG_BLK0, a second block BLK1 includes DRV/SW_BLK1, PT_BLK1 and WL/SG_BLK1, a third block BLK2 includes DRV/SW_BLK2, PT_BLK2 and WL/SG_BLK2 and a fourth block BLK3 includes DRV/SW_BLK3, PT_BLK3 and WL/SG_BLK3. A common pass transistor voltage Vpt_0 is provided for GRP0 on a line CG line_0.

In GRP1, a fifth block BLK4 includes DRV/SW_BLK4, PT_BLK4 and WL/SG_BLK4, a sixth block BLK5 includes DRV/SW_BLK5, PT_BLK5 and WL/SG_BLK5, a seventh block BLK6 includes DRV/SW_BLK6, PT_BLK6 and WL/SG_BLK6 and an eighth block BLK7 includes DRV/SW_BLK7, PT_BLK7 and WL/SG_BLK7. A common pass transistor voltage Vpt_1 is provided for GRP1 on a line CG line_1.

In one approach, an apparatus includes first means for applying voltages to word lines in a first block of memory cells via pass transistors of the first block; second means for applying voltages to word lines in a second block of memory cells via pass transistors of the second block, wherein control gates of the pass transistors of the first block and of the pass transistors are connected to one another; and means for controlling the first means, the second means and a voltage of the control gates, wherein the means for controlling controls the first means to perform an operation on the memory cells of the first block and, at the same time, if a condition is met, control the second means to set voltages on the word lines in the second block according to a negative temperature coefficient.

The means described above can include the components of the memory device 100 of FIG. 1A, for example. The power control module 116, for instance, controls the power and voltages supplied to the word lines, select gate lines and bit lines during memory operations. Moreover, the means described above can include the components of FIGS. 18A and 18B including the voltage drivers, switches and pass transistors. The means for controlling can include any of the control circuits in FIG. 1A such as the control circuitry 110 and controller 122.

The first condition may be met when a first read situation is not present in the second block, e.g., the second read situation is present, a time period since a last sensing operation in the block is below a threshold and/or the temperature is below a threshold.

The blocks of a group can be arranged in different ways on the substrate of a memory device. In one approach, the blocks in a group are adjacent to one another. In another possible approach, the blocks in a group alternate with blocks in another group.

FIG. 18B depicts an example circuit which includes the voltage drivers DRV_BLK0, switches SW_BLK0, pass transistors PT_BLK0 and word lines and select gate lines WL/SG_BLK0 of BLK0 of FIG. 18A. DRV_BLK0 includes various voltage drivers, such as charge pumps. These may be provided as part of the power control module 116 of FIG. 1A, for example. An SGD0 driver 1801 provides a voltage to an SGD0 control line. An SGD1 driver 1802 provides a voltage to an SGD1 control line. A WLD2 driver 1803 provides a voltage to a WLD2 word line. A WLD1 driver 1804 provides a voltage to a WLD1 word line. A WL_SEL driver 1804 provides a voltage to any of the data word lines WLL0-WLL10 which is selected for programming or reading. These voltages could include a program voltage Vpgm, a verify voltage Vv, a read voltage Vcgr and Vdummy. Optionally, separate voltage drivers can be provided for Vpgm, Vv, Vcgr and/or Vdummy.

A WL_UNSEL driver 1805 provides a voltage to any of the data word lines WLL0-WLL10 which is unselected. These voltages could include a pass voltage Vpass, Vblk_unsel_tco, Vdd, Vsl and Vdummy, as discussed in FIGS. 17E and 17F. Optionally, separate voltage drivers can be provided for Vpass, Vblk_unsel_tco, Vdd, Vsl and/or Vdummy.

A WLD3 driver 1806 provides a voltage to a WLD3 word line. A WLD4 driver 1807 provides a voltage to a WLD4 word line. An SGS1 driver 1808 provides a voltage to an SGS1 control line. An SGS0 driver 1809 provides a voltage to an SGS0 control line.

A set of switches 1820-1830 in SW_BLK0 are responsive to control signals to pass the voltage from one of the drivers 1804 or 1805 to the respective data word line. Switches 1820, 1821, 1822, 1823, 1824, 1825, 1826, 1827, 1828, 1829 and 1830 are used for word lines WLL0-WLL10, respectively. The switches 1820-1830 can also be controlled to disconnect a driver from the respective data word line. For example, a driver providing Vdummy can be disconnected to float the voltages of the data word lines as discussed to allow coupling up of the voltages.

PT_BLK0 includes an example pass transistor 1810 having a control gate 1811. As mentioned, the control gates of the pass transistors in a group of blocks are connected to one another and receive a common control gate voltage, e.g., Vpt_0.

In one approach, the data word lines receive the same voltage, Vdummy. However, other approaches are possible which allow different data word lines to receive different dummy voltages. For example, in a 3D memory device in which strings of cells extend vertically, Vdummy may be adjusted based on the pillar or memory hole diameter so that Vdummy is relatively smaller when the diameter/width is relatively smaller. This accounts for an increased amount of coupling when the diameter/width is relatively smaller. As mentioned in connection with FIG. 5, with a relatively smaller diameter portion of a memory hole, the electric field across the tunnel oxide is relatively stronger, so that the programming and erase speed is higher. Similarly, coupling up due to the dummy voltage will be stronger. Adjusting Vdummy based on the pillar or memory hole diameter helps even out the amount of coupling up across the word line layers in the stack. This results in consistent Vth levels across the word line layers.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a block comprising memory cells, the memory cells are arranged in strings and connected to a set of word lines, and the memory cells are programmed to different programmed data states including a lowest programmed data state and a highest programmed data state; and
   a control circuit, the control circuit is configured to perform a countermeasure for a first read situation in the block, wherein the countermeasure is a function of a temperature and to perform the countermeasure, the control circuit is configured to set a read voltage of the lowest programmed data state according to a positive temperature coefficient, and to set a read voltage of the highest programmed data state according to a negative temperature coefficient.

2. The apparatus of claim 1, wherein:
   the control circuit is configured to set the countermeasure to be relatively more severe when the temperature is relatively lower.

3. The apparatus of claim 1, wherein:
   the block is in the first read situation if no sensing operation has occurred in the block since a last power on event.

4. The apparatus of claim 1, wherein:
   the block is in the first read situation if a time period since a last sensing operation in the block exceeds a threshold.

5. The apparatus of claim 1, wherein:
   the word lines are connected to voltage drivers; and
   the block is in the first read situation if a coupled up potential of the word lines is discharged by voltages provided by the voltage drivers.

6. The apparatus of claim 1, wherein:
   to perform the countermeasure, the control circuit is configured to set read voltages of lower programmed data states according to different positive temperature coefficients, wherein a largest magnitude positive temperature coefficient is used for the lowest programmed data state, and to set read voltages of higher programmed data states according to different negative temperature coefficients, wherein a largest magnitude negative temperature coefficient is used for the highest programmed data state.

7. The apparatus of claim 1, wherein:
   to perform the countermeasure, the control circuit is configured to:
   perform a read operation on the memory cells using read voltages comprising an initial read voltage for the lowest programmed data state and an initial read voltage for the highest programmed data state, and
   if a number of errors in the read operation exceeds an error threshold, perform another read operation on the memory cells using an adjusted read voltage of the lowest programmed data state and an adjusted read voltage of the highest programmed data state, wherein the adjusted read voltage of the lowest programmed data state is less than the initial read voltage for the lowest programmed data state based on the positive temperature coefficient, and the adjusted read voltage of the highest programmed data state is greater than the initial read voltage for the highest programmed data state based on the negative temperature coefficient.

8. The apparatus of claim 1, wherein:
   to perform the countermeasure, the control circuit is configured to, in response to a read command involving a selected word line of the block, apply a dummy voltage to each word line, subsequently float a voltage of each word line, wait for a period of time according to the negative temperature coefficient, and perform a read operation involving the selected word line; and
   the memory cells are not sensed during the dummy voltage.

9. The apparatus of claim 1, wherein:
   to perform the countermeasure, the control circuit is configured to set a pass voltage of unselected word lines according to a negative temperature coefficient when a read voltage of the lowest programmed data state is applied to a selected word line, and according to a positive temperature coefficient when a read voltage of the highest programmed data state is applied to a selected word line.

10. The apparatus of claim 1, wherein:
    to perform the countermeasure, the control circuit is configured to set a pass voltage of unselected word lines according to different negative temperature coefficients when read voltages are applied to a selected word line for lower programmed data states, wherein a largest magnitude negative temperature coefficient is used during a read voltage for the lowest programmed data state, and to set the pass voltage of the unselected word lines according to different positive temperature coefficients when read voltages are applied to the selected word line for higher programmed data states, wherein a largest magnitude positive temperature coefficient is used during a read voltage for the highest programmed data state.

11. A method, comprising:
    in response to a read command involving memory cells in a block, determining when a first read situation exists in the block, and whether a temperature is below a threshold, wherein the memory cells are programmed to different programmed data states including a lowest programmed data state and a highest programmed data state; and
    when the first read situation exists in the block and the temperature is below the threshold, reading the memory cells using an initial read voltage for the lowest programmed data state which is set according to a positive temperature coefficient, and using an initial read voltage of the highest programmed data state which is set according to a negative temperature coefficient.

12. The method of claim 11, further comprising:
    determining when a number of errors in the reading of the memory cells exceeds an error threshold; and
    when the number of errors in the reading of the memory cells exceeds the error threshold, reading the memory cells using an adjusted read voltage for the lowest programmed data state which is set according to the positive temperature coefficient and which is less than the initial read voltage for the lowest programmed data state.

13. The method of claim 11, wherein:
    the first read situation exists when no sensing operation has occurred in the block since a power on event.

14. The method of claim 11, wherein:

the first read situation exists when a time period since a last sensing operation in the block exceeds a threshold.

15. The method of claim 11, further comprising:

determining when a number of errors in the reading of the memory cells exceeds an error threshold; and when the number of errors in the reading of the memory cells exceeds the error threshold, reading the memory cells using an adjusted read voltage of the highest programmed data state which is set according to the negative temperature coefficient and which is greater than the initial read voltage for the highest programmed data state.

16. An apparatus, comprising:

a block comprising memory cells, the memory cells are arranged in strings and connected to a set of word lines, and the memory cells are programmed to different programmed data states including a lowest programmed data state and a highest programmed data state; and a control circuit, the control circuit is configured to set a read voltage of the lowest programmed data state according to a positive temperature coefficient, and to set a read voltage of the highest programmed data state according to a negative temperature coefficient.

17. The apparatus of claim 16, wherein:

the control circuit is configured to set read voltages of lower programmed data states according to different positive temperature coefficients, wherein a largest magnitude positive temperature coefficient is used for the lowest programmed data state.

18. The apparatus of claim 16, wherein:

the control circuit is configured to set read voltages of higher programmed data states according to different negative temperature coefficients, wherein a largest magnitude negative temperature coefficient is used for the highest programmed data state.

* * * * *